United States Patent
Hayashi

(10) Patent No.: US 12,316,085 B2
(45) Date of Patent: May 27, 2025

(54) WIRE HARNESS WITH FIXING MECHANISM FOR ELECTROMAGNETIC WAVE ABSORBING MEMBER

(71) Applicant: SUMITOMO WIRING SYSTEMS, LTD., Yokkaichi (JP)

(72) Inventor: Masashi Hayashi, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 225 days.

(21) Appl. No.: 17/798,624

(22) PCT Filed: Feb. 17, 2021

(86) PCT No.: PCT/JP2021/005791
§ 371 (c)(1),
(2) Date: Aug. 10, 2022

(87) PCT Pub. No.: WO2021/172117
PCT Pub. Date: Sep. 2, 2021

(65) Prior Publication Data
US 2023/0088375 A1 Mar. 23, 2023

(30) Foreign Application Priority Data
Feb. 25, 2020 (JP) .................. 2020-029719

(51) Int. Cl.
*H02G 3/04* (2006.01)
*H05K 9/00* (2006.01)

(52) U.S. Cl.
CPC ............. *H02G 3/0456* (2013.01); *H05K 9/00* (2013.01)

(58) Field of Classification Search
CPC .. H02G 3/0456; H02G 3/0462; H02G 3/0468; H02G 3/0475; H02G 3/0481; H02G 3/0487
See application file for complete search history.

(56) References Cited

U.S. PATENT DOCUMENTS

| 8,399,767 B2 * | 3/2013 | Duquette ................. H05F 3/00 29/829 |
| 9,345,179 B2 * | 5/2016 | Imahori ............... H05K 9/0066 |
| 9,622,393 B2 * | 4/2017 | Imahori ............... H05K 9/0098 |

(Continued)

FOREIGN PATENT DOCUMENTS

JP    H03-13797 U    2/1991

OTHER PUBLICATIONS

Apr. 6, 2021 International Search Report issued in International Patent Application No. PCT/JP2021/005791.

*Primary Examiner* — Rockshana D Chowdhury
*Assistant Examiner* — Douglas R Burtner
(74) *Attorney, Agent, or Firm* — Oliff PLC

(57) ABSTRACT

A wire harness including: a wire; a positioning member that is made of a synthetic resin and is provided on an outer circumference of the wire; a ring-shaped electromagnetic wave absorber that has a through hole through which the wire passes and is fixed to the positioning member; and a fixing member for fixing the positioning member to the wire, wherein: the positioning member includes a main body including an insertion portion inserted in the through hole, and a fixing portion protruding from the main body to an outside of the through hole, and the fixing member is formed so as to fasten the wire and the fixing portion to each other.

8 Claims, 10 Drawing Sheets

(56) References Cited

U.S. PATENT DOCUMENTS

| | | | | |
|---|---|---|---|---|
| 9,762,041 | B1* | 9/2017 | Yeh | H02G 3/0406 |
| 9,947,435 | B2* | 4/2018 | Oka | H02G 3/0406 |
| 10,529,482 | B2* | 1/2020 | Oka | H01F 27/363 |
| 11,105,449 | B1* | 8/2021 | Eaton | F16L 51/00 |
| 2007/0187144 | A1* | 8/2007 | Kato | B60R 16/0215 |
| | | | | 174/72 A |
| 2014/0182922 | A1* | 7/2014 | Imahori | H01F 17/06 |
| | | | | 174/72 A |
| 2015/0287497 | A1* | 10/2015 | Shiga | B60R 16/0215 |
| | | | | 174/84 R |
| 2015/0334882 | A1* | 11/2015 | Sugino | H02G 3/0481 |
| | | | | 29/428 |
| 2016/0134090 | A1* | 5/2016 | Kushima | H05K 9/0098 |
| | | | | 174/362 |
| 2016/0148722 | A1* | 5/2016 | Hagi | H01B 7/2825 |
| | | | | 174/128.1 |
| 2016/0273796 | A1* | 9/2016 | Lee | F24F 11/89 |
| 2016/0362074 | A1* | 12/2016 | Yamaguchi | B60R 16/0215 |
| 2016/0366796 | A1* | 12/2016 | Wakabayashi | H02G 3/0487 |
| 2017/0181337 | A1* | 6/2017 | Itani | H02G 3/0462 |
| 2017/0207613 | A1* | 7/2017 | Nakai | H02G 3/0481 |
| 2017/0263350 | A1* | 9/2017 | Oka | H01R 11/12 |
| 2017/0331264 | A1* | 11/2017 | Yeh | H02G 3/0691 |
| 2018/0114612 | A1* | 4/2018 | Itani | B60R 16/03 |
| 2018/0174709 | A1* | 6/2018 | Hagi | B60L 15/00 |
| 2018/0184552 | A1* | 6/2018 | Omae | H02G 3/0468 |
| 2018/0241186 | A1* | 8/2018 | Gibboney, Jr. | H02G 3/0462 |
| 2018/0301242 | A1* | 10/2018 | Sugino | H05K 9/0098 |
| 2019/0296533 | A1* | 9/2019 | Yeh | H02G 3/065 |
| 2019/0308571 | A1* | 10/2019 | Hagi | H01B 3/50 |
| 2019/0330808 | A1* | 10/2019 | Annan | D07B 1/148 |
| 2019/0334332 | A1* | 10/2019 | Yeh | H02G 3/0616 |
| 2019/0393686 | A1* | 12/2019 | Hiromori | H02G 3/0616 |
| 2020/0227899 | A1* | 7/2020 | Yeh | H02G 3/0616 |
| 2020/0350097 | A1* | 11/2020 | Sugino | H01B 7/20 |
| 2020/0366074 | A1* | 11/2020 | Little | H02G 3/22 |
| 2020/0375073 | A1* | 11/2020 | Fujioka | H02G 3/0481 |
| 2021/0119428 | A1* | 4/2021 | Kimoto | B60R 16/0215 |
| 2021/0291757 | A1* | 9/2021 | Nakai | H01B 7/17 |
| 2023/0106031 | A1* | 4/2023 | Mizutani | H02G 3/0406 |
| | | | | 174/350 |
| 2023/0126637 | A1* | 4/2023 | Tremelling | H02G 3/0462 |
| | | | | 174/68.3 |
| 2023/0192014 | A1* | 6/2023 | Maruchi | B60R 16/0215 |
| | | | | 174/72 A |
| 2023/0234520 | A1* | 7/2023 | Maruchi | B60R 16/0215 |
| | | | | 174/72 A |
| 2023/0271568 | A1* | 8/2023 | Maruchi | H02G 3/03 |
| | | | | 174/72 A |

* cited by examiner

WIRE HARNESS WITH FIXING MECHANISM FOR ELECTROMAGNETIC WAVE ABSORBING MEMBER

BACKGROUND

This disclosure relates to a wire harness.

Conventionally, wire harnesses, which are provided with wires that electrically connect a plurality of electrical devices and electromagnetic wave absorbing members that absorb electromagnetic waves (electromagnetic noise) emitted from the wires, are known as wire harnesses that are mounted in vehicles such as hybrid vehicles and electric vehicles. As a result of inserting a plurality of wires into a through hole in an electromagnetic wave absorbing member constituted by a ferrite core, the electromagnetic wave absorbing member is provided on an outer circumference of the wires in a wire harness of this type (see JP 2014-130886A, for example).

SUMMARY

Incidentally, with the above-described wire harness, the larger the electromagnetic waves to be reduced are, the larger the size of the electromagnetic wave absorbing member is. When a wire is inserted into such a large electromagnetic wave absorbing member, there is a risk that the electromagnetic wave absorbing member may vibrate due to vibration accompanying traveling of the vehicle or the like, for example, and the wire may be shaken by the vibration of the electromagnetic wave absorbing member, and the wire may be damaged.

An exemplary aspect of the disclosure provides a wire harness capable of reducing damage to a wire.

The wire harness of the present disclosure includes: a wire; a positioning member that is made of a synthetic resin and is provided on an outer circumference of the wire; a ring-shaped electromagnetic wave absorber that has a through hole through which the wire passes and is fixed to the positioning member; and a fixing member for fixing the positioning member to the wire, wherein: the positioning member includes a main body including an insertion portion inserted in the through hole, and a fixing portion protruding from the main body to an outside of the through hole, and the fixing member is formed so as to fasten the wire and the fixing portion to each other.

According to the wire harness of the present disclosure, an effect of being able to reduce damage to a wire is exhibited.

DETAILED DESCRIPTION OF EMBODIMENTS

Figure 1:
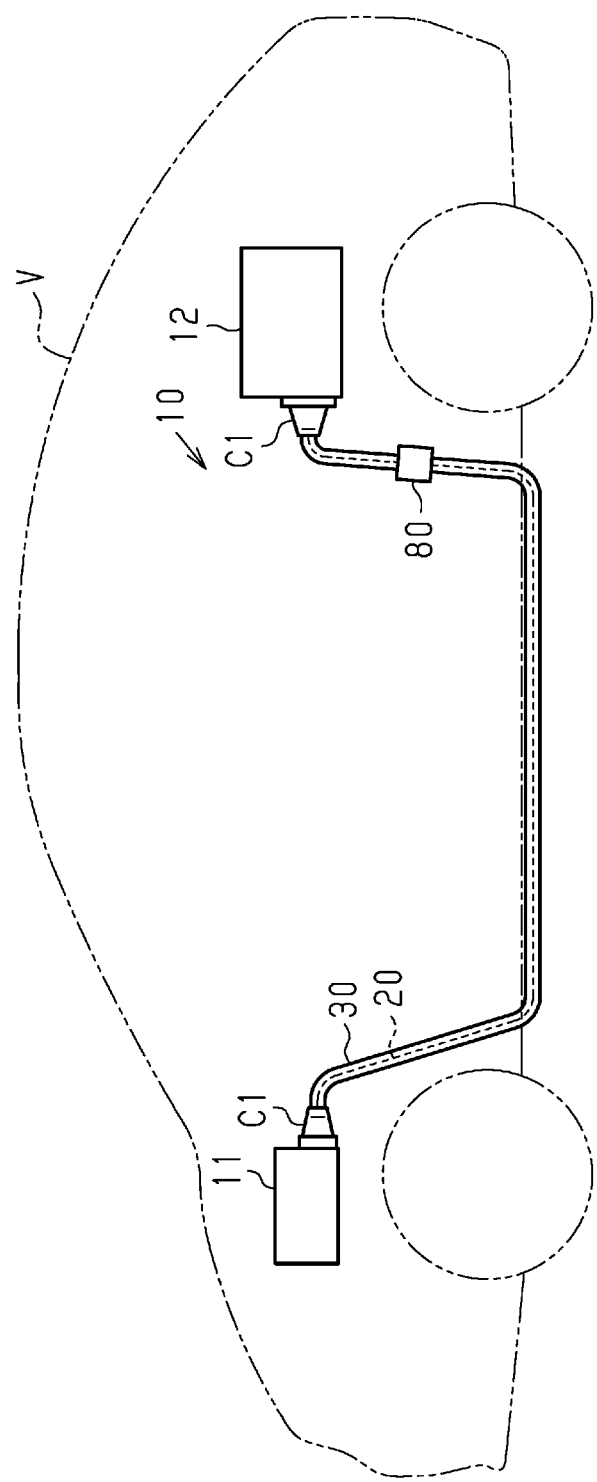
FIG. 1 is a schematic configuration diagram showing a wire harness according to an embodiment.

First, embodiments of the present disclosure will be listed and described.

[1] The wire harness of the present disclosure includes: a wire; a positioning member that is made of a synthetic resin and is provided on an outer circumference of the wire; a ring-shaped electromagnetic wave absorbing member that has a through hole through which the wire passes and is fixed to the positioning member; and a fixing member for fixing the positioning member to the wire, in which the positioning member includes a main body portion including an insertion portion inserted in the through hole, and a fixing portion protruding from the main body portion to the outside of the through hole, and the fixing member is formed so as to fasten the wire and the fixing portion to each other.

According to this configuration, the insertion portion of the positioning member is inserted inside the through hole of the electromagnetic wave absorbing member. As a result, a positioning member made of a synthetic resin can be interposed between the inner circumferential surface of the through hole and the wire. For this reason, it is possible to suppress direct contact between the inner circumferential surface of the through hole and the outer circumferential surface of the wire. As a result, even if the electromagnetic wave absorbing member vibrates due to traveling of the vehicle or the like, it is possible to suppress damage to the wire caused by contact with the edge of the inner circumferential surface of the through hole.

Also, the positioning member is fixed to the wire by the fixing member, and the electromagnetic wave absorbing member is fixed to the positioning member. For this reason, it is possible to suppress positional misalignment of the positioning member with respect to the wire, and it is possible to suppress positional misalignment of the electromagnetic wave absorbing member with respect to the wire.

Here, a "ring" in the present specification includes a circular ring having a circular outer edge shape, a ring having an elliptical or ovoid outer edge shape, a polygonal ring having a polygonal outer edge shape, and a ring having a polygonal outer edge shape with rounded corners, and refers to a ring whose outer shape is composed of any closed shape connected by straight lines or curved lines. A "ring" includes a ring that is a shape having a through hole in a plan view, a shape in which the outer edge shape and the inner circumference shape of the through hole are the same shape, and a shape in which the outer edge shape and the inner circumference shape of the through hole are different from each other. A "ring" includes a ring having a predetermined length extending along the central axis direction in which the central axis passing through the center of the through hole extends, and the length thereof may be large or small. Also, a "ring" in the present specification may be regarded as a ring overall, and includes an object having a notch in a portion thereof, as with a C-shaped object.

[2] It is preferable that the positioning member has a first protruding portion that is provided between the insertion portion and the fixing portion and protrudes in a direction intersecting a length direction of the wire from an outer circumferential surface of the main body portion, and the first protruding portion opposes a first side surface of the electromagnetic wave absorbing member.

According to this configuration, the electromagnetic wave absorbing member can be easily positioned with respect to the positioning member by bringing the first side surface of the electromagnetic wave absorbing member into contact with the first protruding portion. For this reason, the assembly workability of the wire harness can be improved. Also, by bringing the first side surface of the electromagnetic wave absorbing member into contact with the first protruding portion, it is possible to restrict relative movement of the electromagnetic wave absorbing member with respect to the positioning member in the length direction of the wire. This makes it possible to suitably suppress positional misalignment of the electromagnetic wave absorbing member with respect to the positioning member.

Here, "opposing" in the present specification means that surfaces or members are in front of each other, and encompasses not only the case where they are completely in front of each other, but also the case where they are partially in front of each other. Also, the term "opposing" in the present specification encompasses both the case where a member different from two portions is interposed between the two portions and the case where nothing is interposed between the two portions.

[3] It is preferable that the first protruding portion is formed such that an amount of protrusion from the outer circumferential surface of the main body portion decreases from the insertion portion side to the fixing portion side.

According to this configuration, the outer circumferential surface of the first protruding portion is formed in a tapered shape. For this reason, for example, even if a braided member or the like that is easily damaged is provided so as to surround the outer circumference of the first protruding portion, it is possible to suitably suppress damage to the braided member caused by contact with the outer circumferential surface of the first protruding portion.

[4] It is preferable that the main body portion has a tubular shape through which the wire passes, the main body portion has a slit that extends in an axial direction of the main body portion, the positioning member has a second protruding portion that protrudes in a direction intersecting the axial direction from the outer circumferential surface at an end portion on the side opposite to the fixing portion out of the end portions in the axial direction of the main body portion, and the second protruding portion opposes a second side surface of the electromagnetic wave absorbing member.

According to this configuration, since the insertion portion is formed in a tubular shape, it is possible to more suitably suppress direct contact between the inner circumferential surface of the through hole and the outer circumferential surface of the wire. This makes it possible to suppress damage to the wire caused by contact with the edge of the inner circumferential surface of the through hole.

Also, by bringing the second side surface of the electromagnetic wave absorbing member into contact with the second protruding portion, the electromagnetic wave absorbing member can be easily positioned with respect to the positioning member. For this reason, the assembly workability of the wire harness can be improved. Furthermore, by bringing the second side surface of the electromagnetic wave absorbing member into contact with the second protruding portion, it is possible to restrict relative movement of the electromagnetic wave absorbing member with respect to the positioning member in the length direction of the wire. This makes it possible to suitably suppress positional misalignment of the electromagnetic wave absorbing member with respect to the positioning member.

[5] It is preferable that the second protruding portion is formed such that an amount of protrusion from the outer circumferential surface of the main body portion decreases as the distance from the electromagnetic wave absorbing member increases.

According to this configuration, the outer circumferential surface of the second protruding portion is formed in a tapered shape. For this reason, for example, even if a braided member or the like that is easily damaged is provided so as to surround the outer circumferential surface of the second protruding portion, it is possible to suppress damage to the braided member caused by contact with the outer circumferential surface of the second protruding portion.

[6] It is preferable that the second protruding portion is in contact with the second side surface of the electromagnetic wave absorbing member, and the outer circumferential surface of the second protruding portion at the portion in contact with the second side surface is formed so as to be flush with the outer circumferential surface of the electromagnetic wave absorbing member.

According to this configuration, the outer circumferential surface of the second protruding portion is formed flush with the outer circumferential surface of the electromagnetic wave absorbing member, and is formed in a tapered shape such that the amount of protrusion decreases from the portion formed flush with the outer circumferential surface as the distance from the electromagnetic wave absorbing member increases. For example, even if the corner portion of the electromagnetic wave absorbing member is formed at a pin angle, the corner portion of the electromagnetic wave absorbing member can be formed in a pseudo-tapered shape due to the outer circumferential surface of the second protruding portion formed continuously with the outer circumferential surface of the electromagnetic wave absorbing member being formed in a tapered shape. As a result, for example, even if a braided member or the like that is easily damaged is provided so as to surround the outer circumference of the electromagnetic wave absorbing member and the second protruding portion, it is possible to suitably suppress damage to the braided member caused by contact with the electromagnetic wave absorbing member and the outer circumferential surface of the second protruding portion.

[7] It is preferable to further include: an electromagnetic shielding member that surrounds an outer circumference of the wire, the positioning member, and the electromagnetic wave absorbing member; and a restricting member that covers an outer circumferential surface of the electromagnetic shielding member, in which the restricting member is formed such that the electromagnetic shielding member is fastened from the outside of the electromagnetic shielding member toward the wire.

According to this configuration, the electromagnetic waves emitted from the wire can be reduced by the electromagnetic wave absorbing member and the electromagnetic shielding member surrounding the outer circumference of the electromagnetic wave absorbing member. Also, since the electromagnetic shielding member is tightened toward the wire by the restricting member, it is possible to prevent the electromagnetic shielding member from expanding outward in the radial direction of the wire.

[8] It is preferable that the restricting member is provided so as to overlap with the fixing portion in a direction intersecting the length direction of the wire.

According to this configuration, the restricting member is provided so as to surround the outer circumference of the fixing portion. For this reason, the electromagnetic shielding member is fastened toward the wire and the fixing portion by the restricting member. At this time, the thickness of the object to which the electromagnetic shielding member is fastened is thicker by the thickness of the fixing portion compared to the case where the electromagnetic shielding member is fastened to only the outer circumferential surface of the wire, and therefore the level difference between the outer circumferential surface of the electromagnetic wave absorbing member and the outer circumferential surface of the restricting member can be reduced. As a result, it is possible to suppress an increase in the tensile force applied to the electromagnetic shielding member between the portion surrounding the outer circumferential surface of the electromagnetic wave absorbing member and the portion covered by the restricting member, and it is possible to suppress a decrease in the stretchability of the electromagnetic shielding member in that portion. As a result, it is possible to suppress wearing of the electromagnetic shielding member caused by contact with the outer circumferential surface of the electromagnetic wave absorbing member, and it is possible to suppress damage to the electromagnetic shielding member.

[9] It is preferable to further include: a first outer cover member accommodating the wire; a second outer cover member that accommodates the wire and is provided spaced apart from the first outer cover member in the length direction of the wire; and a protective member that covers the outer circumference of the electromagnetic wave absorbing member and the positioning member and is fixed so as to bridge between the outer circumference of the first outer cover member and the outer circumference of the second outer cover member, in which the electromagnetic wave absorbing member is provided between the first outer cover member and the second outer cover member in the length direction of the wire.

According to this configuration, since the outer circumference of the electromagnetic wave absorbing member is covered by the protective member, the protective member can be interposed between the electromagnetic wave absorbing member and its peripheral components. As a result, it is possible to suppress direct contact between the electromagnetic wave absorbing member and the peripheral components, and therefore it is possible to suppress damage to the electromagnetic wave absorbing member caused by contact between the electromagnetic wave absorbing member and the peripheral components.

[10] It is preferable that the first outer cover member is a metal pipe, the second outer cover member is an outer cover member made of a synthetic resin, and the fixing portion is provided between the insertion portion and the second outer cover member.

According to this configuration, the fixing portion is formed so as to extend from the insertion portion toward the second outer cover member. In other words, the fixing portion is formed so as to extend from the insertion portion in a direction away from the first outer cover member, which is a metal pipe. For this reason, for example, even if the holder is attached to the end portion of the metal pipe, it is possible to suitably suppress interference between the holder and the fixing portion of the positioning member.

[11] It is suitable that the protective member is a waterproof member for waterproofing a member accommodated in the protective member, and the fixing member is a tape member wound around the fixing portion and the wire.

According to this configuration, the positioning member can be fixed to the wire by the tape member. Also, since the tape member is provided inside the waterproof member, it is possible to suppress a case in which a liquid such as rainwater comes into contact with the tape member. As a result, it is possible to suitably suppress a decrease in the adhesive force of the tape member caused by contact with the liquid, and therefore it is possible to suitably maintain the fixing of the positioning member and the wire by the tape member.

DETAILED DESCRIPTION OF EMBODIMENT OF THE DISCLOSURE

A specific example of a wire harness according to this disclosure will be described with reference to the drawings below. In the drawings, some of the components may be exaggerated or simplified for the sake of description. Also, the dimensional proportions of some parts may differ from their actual proportions. "Parallel" and "orthogonal" in this specification include not only strictly parallel and orthogonal but also generally parallel and orthogonal in a range in which the effects of this embodiment are achieved. Note that the present disclosure is not limited to these examples, but is indicated by the claims, and all changes that fall within the meaning and range of equivalency of the claims are intended to be embraced therein.

Overall Configuration of Wire Harness 10

A wire harness 10 shown in FIG. 1 electrically connects two or three or more electric devices (devices). The wire harness 10 electrically connects, for example, an inverter 11 installed at the front of a vehicle V such as a hybrid vehicle or an electric vehicle, and a high-voltage battery 12 installed on the rear side of the vehicle V relative to the inverter 11. The wire harness 10 is routed, for example, so as to pass under a floor of the vehicle V or the like. For example, an intermediate portion of the wire harness 10 in the length direction is routed so as to pass outside the vehicle interior, such as under the floor of the vehicle V. The inverter 11 is connected to a wheel drive motor (not shown) that is a power source for vehicle travel. The inverter 11 generates AC power from the DC power of the high-voltage battery 12, and supplies the AC power to the motor. The high-voltage battery 12 is, for example, a battery capable of supplying a voltage of several hundred volts.

The wire harness 10 includes one or a plurality of (in the present embodiment, two) wires 20, a pair of connectors C1 that are attached to both end portions of the wire 20, an outer cover member 30 that collectively surrounds the plurality of wires 20, and an electromagnetic wave absorbing member 80 (electromagnetic wave absorber).

Configuration of Wire 20

One end portion of each wire 20 is connected to the inverter 11 via the connector C1, and the other end of each wire 20 is connected to the high-voltage battery 12 via the connector C1. Each wire 20 is formed in a long shape, for example, so as to extend in the front-rear direction of the vehicle V. Each wire 20 is formed, for example, so as to be bent in a two-dimensional shape or a three-dimensional shape depending on the arrangement path of the wire harness 10. Each wire 20 is, for example, a high-voltage wire capable of handling a high voltage and a large current. Each wire 20 may be, for example, a shielded wire having an electromagnetic shielding structure, or a non-shielded wire having no electromagnetic shielding structure. Each wire 20 of this embodiment is a non-shielded wire.

Figure 2:
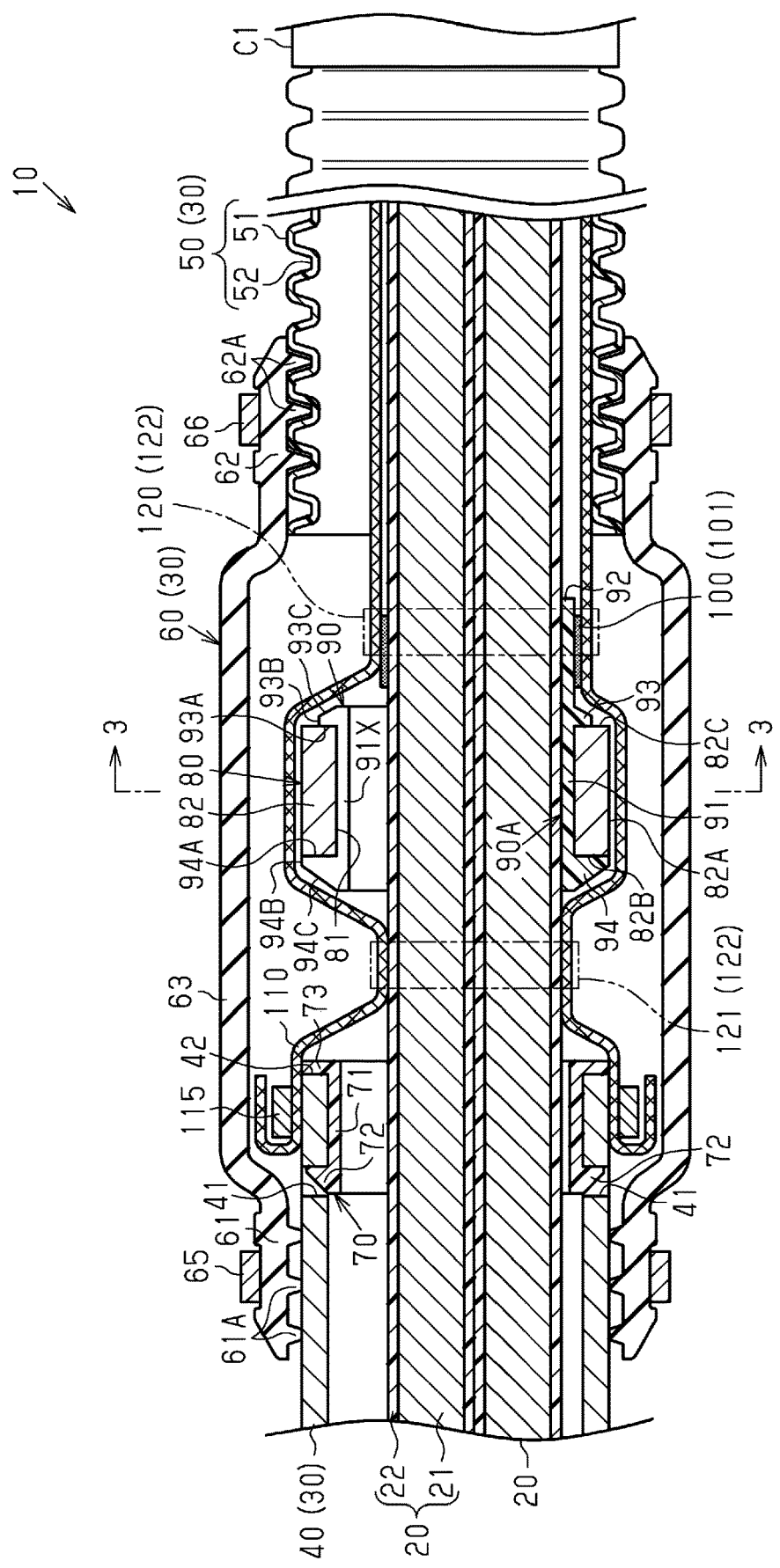
FIG. 2 is a schematic cross-sectional view showing a wire harness according to an embodiment.

As shown in FIG. 2, the wire 20 is a covered wire having a core wire 21 made of a conductor and an insulating covering 22 covering the outer circumference of the core wire 21.

Configuration of Core Wire 21

As the core wire 21, for example, a twisted wire obtained by twisting a plurality of metal strands together, a columnar conductor constituted by one columnar metal rod that is solid, or a tubular conductor that is hollow can be used. As the core wire 21, for example, a twisted wire, a columnar conductor, and a tubular conductor may be used in combination. Examples of the columnar conductor include a single core wire and a bus bar. The core wire 21 in this embodiment is a twisted wire. A metal material such as a copper-based metal material or an aluminum-based metal material can be used as the material of the core wire 21, for example.

The cross-sectional shape (i.e., a transverse cross-sectional shape) obtained by cutting the core wire 21 along a plane orthogonal to the length direction of the core wire 21 may be any shape. The transverse cross-sectional shape of each core wire 21 is a circular, semicircular, polygonal, square, or flat shape, for example. The transverse cross-sectional shape of the core wire 21 in this embodiment is a circular shape.

Configuration of Insulating Covering 22

The insulating coverings 22 respectively cover the outer circumferential surfaces of the core wires 21 over the entire circumference in the circumferential direction, for example. The insulating covering 22 is made of an insulating material such as a synthetic resin, for example. It is possible to use a synthetic resin containing polyolefin-based resin as a main component, such as crosslinked polyethylene or crosslinked polypropylene, as the material of the insulating covering 22, for example. Materials of one or more types can be used alone or in combination of two or more as the material of the insulating covering 22. The insulating covering 22 can be formed through, for example, extrusion molding (extrusion coating) performed on the core wire 21.

Configuration of Outer Cover Member 30

The outer cover member 30 has a long tubular shape overall. A plurality of wires 20 are accommodated in the internal space of the outer cover member 30.

The outer cover member 30 is formed, for example, so as to surround the outer circumference of the plurality of wires 20 over the entire circumference in the circumferential direction. The outer cover member 30 protects the wires 20 from, for example, flying objects and water droplets. As the outer cover member 30, for example, a metal or resin pipe, a resin protector, a flexible corrugated tube made of resin or the like, a rubber waterproof cover, or a combination thereof can be used.

The outer cover member 30 has, for example, a metal pipe 40, a corrugated tube 50, and a protective member 60.

Configuration of Pipe 40

For example, the pipe 40 has a tubular shape that collectively surrounds the outer circumferences of the plurality of wires 20 overall. The pipe 40 is provided, for example, so as to surround the outer circumference of the plurality of wires 20 over the entire circumference in the circumferential direction. The pipe 40 is provided, for example, so as to surround a portion in the length direction (axial direction) of the wires 20. The outer circumferential surface of the pipe 40 is formed, for example, as a smooth surface. The pipe 40 of the present embodiment is formed in a cylindrical shape. As the material of the pipe 40, for example, a metal material that is copper-based, aluminum-based, or the like can be used. The pipe 40 has, for example, a function of collectively electromagnetically shielding the plurality of wires 20 and a function of protecting the plurality of wires 20 from flying objects and water droplets.

For example, a pair of attachment holes 41 are formed at the end portion of the pipe 40. Each attachment hole 41 is formed, for example, so as to pass through the pipe 40 in the radial direction of the pipe 40. Each attachment hole 41 is provided, for example, at a position spaced apart from an end surface 42 in the length direction (axial direction) of the pipe 40.

For example, a holder 70 made of a synthetic resin is attached to the end portion of the pipe 40. The holder 70 is formed, for example, so as to be able to collectively surround the plurality of wires 20. For example, the holder 70 is inserted into the pipe 40 and attached to the end portion of the pipe 40. The holder 70 has a function of protecting the insulating coverings 22 of the wires 20 from the edge of the opening end of the pipe 40, for example, by being arranged inside the metal pipe 40. As the material of the holder 70, for example, a synthetic resin such as polyolefin, polyamide, polyester, or ABS resin can be used.

Configuration of Holder 70

The holder 70 has, for example, a main body portion 71 formed in a tubular shape, a pair of projecting portions 72 formed on the outer circumferential surface of the main body portion 71, and a protruding portion 73 formed on the outer circumferential surface of the main body portion 71. The holder 70 is, for example, a single component in which the main body portion 71, the projecting portions 72, and the protruding portion 73 are formed in one piece using a synthetic resin material.

The main body portion 71 is fitted inside the pipe 40. The main body portion 71 is formed in a shape extending along the inner circumferential surface of the pipe 40. The main body portion 71 of the present embodiment is formed in a cylindrical shape overall. The outer diameter of the main body portion 71 is formed to be one size smaller than the inner diameter of the pipe 40, for example. Although not shown in the drawings, a slit extending over the entire length in the axial direction of the main body portion 71 is formed in the main body portion 71.

Each projecting portion 72 is formed, for example, so as to protrude outward in the radial direction of the main body portion 71 from the outer circumferential surface at one end portion in the axial direction of the main body portion 71. Each projecting portion 72 is locked, for example, to an attachment hole 41 of the pipe 40. The holder 70 is fixed to the end portion of the pipe 40 by locking the projecting portions 72 to the attachment holes 41.

The protruding portion 73 is formed, for example, so as to protrude outward in the radial direction of the main body portion 71 from the outer circumferential surface of the end portion on the side opposite to the projecting portions 72 among the end portions in the axial direction of the main body portion 71. The protruding portion 73 is formed, for example, so as to extend along the circumferential direction of the main body portion 71. For example, the protruding portion 73 is formed over the entire length in the circumferential direction of the main body portion 71. The protruding portion 73 opposes, for example, the end surface 42 in the axial direction of the pipe 40. The protruding portion 73 is in contact with, for example, the end surface 42 in the axial direction of the pipe 40.

Configuration of Corrugated Tube 50

The corrugated tube 50 is provided, for example, spaced apart from the pipe 40 in the length direction of the wire 20. The corrugated tube 50 is provided, for example, between the pipe 40 and the connector C1. The end portion of the corrugated tube 50 is connected, for example, to the connector C1. The corrugated tube 50 has, for example, a tubular shape that collectively surrounds the outer circumference of a plurality of wires 20 overall. The corrugated tube 50 is provided, for example, so as to surround the outer circumference of the plurality of wires 20 over the entire circumference in the circumferential direction. The corrugated tube 50 is provided, for example, so as to surround a portion in the length direction of the wires 20. The corrugated tube 50 has an accordion structure in which ring-shaped protrusions 51 and ring-shaped recesses 52 are arranged alternatingly along the length direction thereof. The corrugated tube 50 is more flexible than the core wire 21. The corrugated tube 50 of the present embodiment is formed in a cylindrical shape. Note that as the material of the corrugated tube 50, for example, a resin material having conductivity or a resin material having no conductivity can be used. As the resin material, for example, a synthetic resin such as polyolefin, polyamide, polyester, and ABS resin can be used.

Configuration of Protective Member 60

The protective member 60 is provided, for example, so as to bridge between the outer circumference of the pipe 40 and the outer circumference of the corrugated tube 50. The protective member 60 has, for example, a tubular shape in which both ends in the length direction of the wire 20 are open. As the material of the protective member 60, for example, an elastic material having a relatively high hardness can be used. As the elastic material, for example, rubber such as ethylene propylene diene rubber or elastomer can be used.

Configuration of Wire Harness 10

The wire harness 10 has, for example, a positioning member 90 provided on the outer circumference of the wires 20, an electromagnetic wave absorbing member 80 fixed to the positioning member 90, and a fixing member 100 fixing the positioning member 90 to the wires 20. The wire harness 10 has a braided member 110 that surrounds the wires 20, and restricting members 120 and 121 that cover the outer circumferential surface of the braided member 110.

Configuration of Electromagnetic Wave Absorbing Member 80

The electromagnetic wave absorbing member 80 is provided, for example, on the outer circumference of the wires 20 located between the pipe 40 and the corrugated tube 50. For example, in the length direction of the wire 20, the pipe 40 is provided on one side of the electromagnetic wave absorbing member 80, and the corrugated tube 50 is provided on the other side of the electromagnetic wave absorbing member 80. The electromagnetic wave absorbing member 80 is provided, for example, spaced apart from the pipe 40 in the length direction of the wire 20. The electromagnetic wave absorbing member 80 is provided, for example, spaced apart from the corrugated tube 50 in the length direction of the wire 20. The electromagnetic wave absorbing member 80 is exposed from, for example, the pipe 40 and the corrugated tube 50. The electromagnetic wave absorbing member 80 is provided, for example, so as to collectively surround the outer circumference of the plurality of wires 20. The electromagnetic wave absorbing member 80 absorbs some of the electromagnetic waves (electromagnetic noise) emitted from, for example, the plurality of wires 20.

The electromagnetic wave absorbing member 80 has, for example, a through hole 81 through which the plurality of wires 20 collectively pass. The electromagnetic wave absorbing member 80 has a ring shape, for example, due to having the through hole 81. The electromagnetic wave absorbing member 80 has, for example, a through hole 81 in a plan view from the length direction of the wire 20, and is formed in a ring shape having a predetermined length extending along the central axis direction in which the central axis passing through the center of the through hole 81 extends. In the present embodiment, the central axis direction of the electromagnetic wave absorbing member 80 is set to be a direction that extends parallel to the length direction of the wire 20. Note that in the following description, when the term "central axis direction" is simply used, it is assumed to mean the central axis direction of the electromagnetic wave absorbing member 80.

The through hole 81 is formed so as to pass through the electromagnetic wave absorbing member 80 in the length direction of the wire 20, for example. The plurality of wires 20 are provided so as to pass through the through hole 81, for example. The inner circumferential surface of the through hole 81 faces the outer circumferential surface of the wire 20.

The electromagnetic wave absorbing member 80 of the present embodiment is constituted by only a ring-shaped magnetic core 82. The magnetic core 82 of the present embodiment is formed in a circular ring shape. The magnetic core 82 has, for example, a function of reducing electromagnetic waves emitted from the wire 20 due to being arranged so as to oppose the wire 20 over the entire circumference in the circumferential direction of the wire 20. For example, the magnetic core 82 absorbs electromagnetic waves emitted from the wire 20 and converts the energy of the electromagnetic waves into mechanical energy such as vibration or thermal energy. As a result, the adverse effect of the electromagnetic waves emitted from the wire 20 on peripheral devices and the like is reduced.

The magnetic core 82 is, for example, a molded body containing a soft magnetic material. Examples of the soft magnetic material include iron (Fe), iron alloys and ferrites. Examples of the iron alloys include a Fe-silicon (Si) alloy and a Fe-nickel (Ni) alloy. As the magnetic core 82, for example, a ferrite core, an amorphous core, or a permalloy core can be used. The ferrite core is made of, for example, soft ferrite exhibiting soft magnetism. Examples of the soft ferrite include a ferrite containing nickel (Ni) and zinc (Zn) and a ferrite containing manganese (Mn) and zinc (Zn). The material of the magnetic core 82 can be appropriately selected, for example, according to the frequency band of the electromagnetic noise to be reduced.

Figure 3:
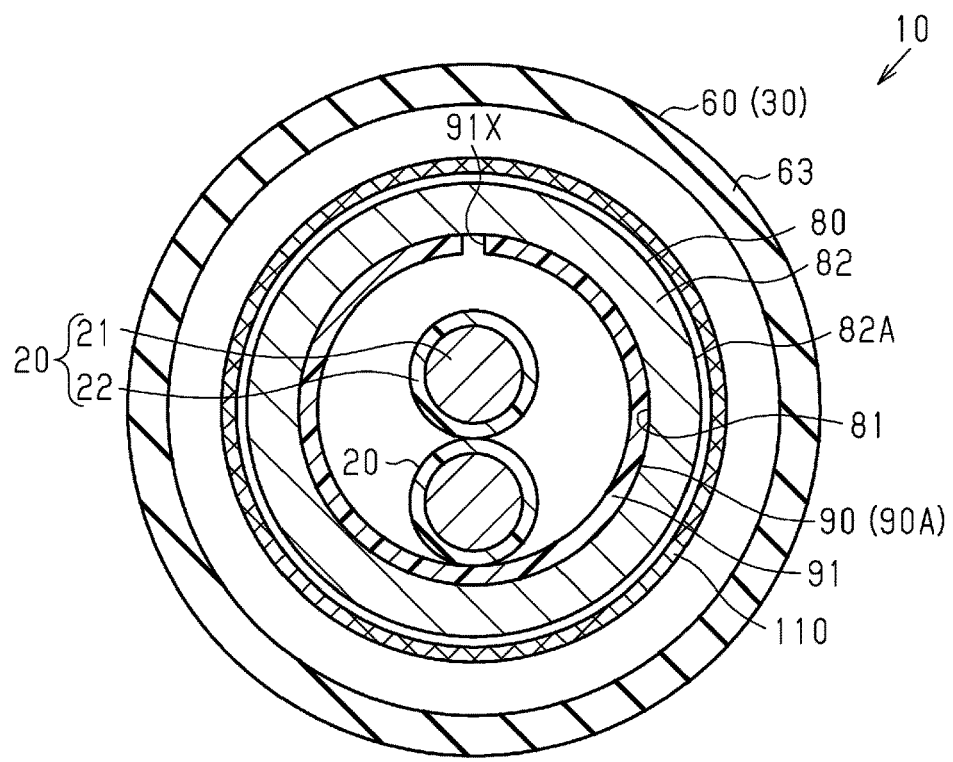
FIG. 3 is a schematic transverse cross-sectional view (a cross-sectional view taken along line 3-3 in FIG. 2) showing a wire harness according to an embodiment.

As shown in FIG. 3, the magnetic core 82 of the present embodiment is formed continuously over the entire circumference in the circumferential direction, and is formed in a closed ring shape. That is, the magnetic core 82 of the present embodiment is formed in a structure in which the entirety is connected to form a continuous ring, that is, an endless structure in which the start point and the end point coincide with each other. In other words, no slit that extends along the central axis direction of the electromagnetic wave absorbing member 80 is formed in the magnetic core 82 of the present embodiment. The magnetic core 82 of this embodiment is constituted by one component. Note that although the magnetic core 82 is constituted by one component in the present embodiment, a plurality of core materials may be combined to form a ring-shaped magnetic core 82. For example, the magnetic core 82 may be formed into a circular ring shape by combining a pair of core materials having semicircular transverse cross sections.

As shown in FIG. 2, the magnetic core 82 has, for example, an outer circumferential surface 82A extending along the circumferential direction of the magnetic core 82, a side surface 82B that extends along the radial direction of the magnetic core 82 and faces the pipe 40 side, and a side surface 82C that extends along the radial direction of the magnetic core 82 and faces the corrugated tube 50 side. The side surfaces 82B and 82C are provided, for example, between the outer circumferential surface 82A and the inner circumferential surface of the through hole 81. The outer circumferential dimension of the magnetic core 82 is set to be larger than the inner circumferential dimension of the pipe 40 and the corrugated tube 50, for example.

The magnetic core 82 is provided, for example, on the outer circumferential surface of the positioning member 90. The magnetic core 82 is fitted, for example, to the outer circumference of the positioning member 90.

Configuration of Positioning Member 90

The positioning member 90 is provided on the outer circumference of the wire 20 located between the pipe 40 and the corrugated tube 50, for example. For example, in the length direction of the wires 20, the pipe 40 is provided on one side of the positioning member 90, and the corrugated tube 50 is provided on the other side of the positioning member 90. The positioning member 90 is provided, for example, spaced apart from the pipe 40 in the length direction of the wires 20. The positioning member 90 is provided, for example, spaced apart from the corrugated tube 50 in the length direction of the wires 20. The positioning member 90 is exposed from, for example, the pipe 40 and the corrugated tube 50. The positioning member 90 is fixed to, for example, the outer circumferential surface of the wires 20. The positioning member 90 is made of, for example, a synthetic resin. As the material of the positioning member 90, for example, a synthetic resin such as polyolefin, polyamide, polyester, or ABS resin can be used.

The positioning member 90 has, for example, a main body portion 90A including an insertion portion 91 inserted into the through hole 81 of the electromagnetic wave absorbing member 80, and a fixing portion 92 formed so as to protrude from the end surface of the main body portion 90A. The positioning member 90 has, for example, a protruding portion 93 (first protrusion) that is provided between the insertion portion 91 and the fixing portion 92 and protrudes in a direction intersecting the length direction of the wires 20 from the outer circumferential surface of the main body portion 90A, and a protruding portion 94 (second protrusion) that protrudes from the outer circumferential surface of the end portion of the main body portion 90A in a direction intersecting the length direction of the wires 20. The positioning member 90 is, for example, a single component in which the insertion portion 91, the fixing portion 92, and the protruding portions 93 and 94 are formed in one piece using a synthetic resin material.

Configuration of Main Body Portion 90A

The main body portion 90A is formed, for example, in a tubular shape through which the wires 20 pass. The main body portion 90A has, for example, a tubular shape that collectively surrounds the outer circumference of the plurality of wires 20 overall. The main body portion 90A of the present embodiment is formed in a cylindrical shape overall.

Figure 4:
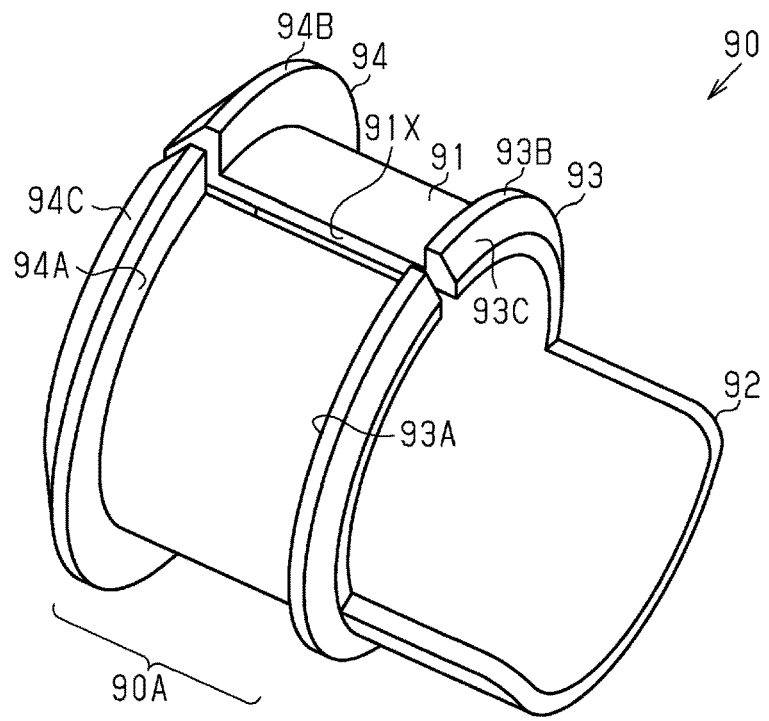
FIG. 4 is a schematic perspective view showing a positioning member according to an embodiment.

As shown in FIG. 4, for example, a slit 91X extending along the axial direction of the main body portion 90A is formed in the main body portion 90A. The slit 91X is formed, for example, so as to extend over the entire length in the axial direction of the main body portion 90A. In the main body portion 90A of the present embodiment, the slit 91X is formed at one position in the circumferential direction of the main body portion 90A. Note that the main body portion 90A may have a plurality of slits 91X.

Configuration of Insertion Portion 91

As shown in FIG. 2, the insertion portion 91 is formed, for example, at an intermediate portion in the axial direction of the main body portion 90A. The insertion portion 91 is fitted, for example, inside the through hole 81. The insertion portion 91 is interposed between the inner circumferential surface of the through hole 81 and the outer circumferential surface of the wires 20, for example. The insertion portion 91 has, for example, a tubular shape that collectively surrounds the outer circumference of the plurality of wires 20 overall. The insertion portion 91 is formed, for example, in a shape extending along the inner circumferential surface of the through hole 81. The insertion portion 91 of the present embodiment is formed in a cylindrical shape overall. The outer diameter of the insertion portion 91 is formed to be one size smaller than the inner diameter of the through hole 81, for example. The outer circumferential surface of the insertion portion 91 is in contact with, for example, the inner circumferential surface of the through hole 81. Note that the contact between the outer circumferential surface of the insertion portion 91 and the inner circumferential surface of the through hole 81 may be in the form of any of surface contact, line contact, and point contact. The inner circumferential surface of the insertion portion 91 opposes, for example, the outer circumferential surface of the wire 20. Due to having the slit 91X, for example, the insertion portion 91 is configured to be able to elastically deform so as to narrow the width of the slit 91X and reduce the diameter when inserted into the through hole 81.

Configuration of Fixing Portion 92

The fixing portion 92 is formed so as to protrude from the main body portion 90A to the outside of the through hole 81. The fixing portion 92 is formed, for example, so as to extend along the axial direction of the main body portion 90A from the end surface in the axial direction of the main body portion 90A. The fixing portion 92 is formed so as to protrude in a direction away from the insertion portion 91. The fixing portion 92 is formed, for example, in only a portion in the circumferential direction of the main body portion 90A. As shown in FIG. 4, the fixing portion 92 is formed, for example, at a position shifted from the slit 91X in the circumferential direction. The fixing portion 92 is formed, for example, at a position shifted from the slit 91X by about n [rad] in the circumferential direction.

The fixing portion 92 is formed in a thin plate shape, for example. The fixing portion 92 has an inner surface (here, the surface facing the upper side in the drawing) opposing the wires 20 (see FIG. 2) and an outer surface on the side opposite to the inner surface. The inner surface and the outer surface of the fixing portion 92 are formed, for example, in a curved plane shape. The inner surface and the outer surface of the fixing portion 92 are formed, for example, on an arc surface coaxial with the main body portion 90A. The inner surface of the fixing portion 92 is formed continuously in one piece without a level difference with the inner circumferential surface of the main body portion 90A.

Configuration of Protruding Portion 93

The protruding portion 93 is formed, for example, so as to protrude outward in the radial direction of the main body portion 90A from the outer circumferential surface of one end portion in the axial direction of the main body portion 90A. The protruding portion 93 is formed, for example, on the outer circumferential surface of the end portion on the fixing portion 92 side among the end portions in the axial direction of the main body portion 90A. The protruding portion 93 is formed, for example, over the entire length in the circumferential direction of the main body portion 90A. Note that the protruding portion 93 may also be formed on only a portion in the circumferential direction of the main body portion 90A.

As shown in FIG. 2, the protruding portion 93 has a side surface 93A opposing the electromagnetic wave absorbing member 80 and an outer circumferential surface 93B, which is a protruding leading end surface of the protruding portion 93. The side surface 93A is formed, for example, so as to extend in the radial direction and the circumferential direction of the main body portion 90A. The side surface 93A is formed, for example, so as to oppose the side surface 82C of the electromagnetic wave absorbing member 80. The side surface 93A is in contact with, for example, the side surface 82C of the electromagnetic wave absorbing member 80. The thickness dimension along the radial direction of the side surface 93A is formed to be smaller than the thickness dimension along the radial direction of the side surface 82C, for example. For this reason, the side surface 93A opposes only a portion in the radial direction of the side surface 82C.

The outer circumferential surface 93B is a surface located on the outer side in the radial direction of the outer surface of the protruding portion 93. The outer circumferential surface 93B is formed, for example, so as to extend in the axial direction and the circumferential direction of the main body portion 90A. The outer circumferential surface 93B has, for example, an inclined surface 93C that is inclined so as to approach the outer circumferential surface of the main body portion 90A from the insertion portion 91 side to the fixing portion 92 side. That is, the outer circumferential surface 93B has an inclined surface 93C that is inclined so as to approach the outer circumferential surface of the main body portion 90A as the distance from the electromagnetic wave absorbing member 80 increases. In other words, the protruding portion 93 is formed such that the amount of protrusion outward in the radial direction from the outer circumferential surface of the main body portion 90A decreases from the insertion portion 91 side to the fixing portion 92 side. The inclined surface 93C is provided, for example, on at least a portion of the outer circumferential surface 93B of the protruding portion 93.

Configuration of Protruding Portion 94

The protruding portion 94 is formed, for example, so as to protrude outward in the radial direction of the main body portion 90A from the outer circumferential surface of one end portion in the axial direction of the main body portion 90A. The protruding portion 94 is formed, for example, on the outer circumferential surface of the end portion on the side opposite to the fixing portion 92 among the end portions in the axial direction of the main body portion 90A. The protruding portion 94 is formed, for example, over the entire length in the circumferential direction of the main body portion 90A. Note that the protruding portion 94 may also be formed on only a portion in the circumferential direction of the main body portion 90A.

The protruding portion 94 has a side surface 94A opposing the electromagnetic wave absorbing member 80 and an outer circumferential surface 94B, which is a protruding leading end surface of the protruding portion 94. The side surface 94A is formed, for example, so as to extend in the radial direction and the circumferential direction of the main body portion 90A. The side surface 94A is formed, for example, so as to oppose the side surface 82B of the electromagnetic wave absorbing member 80. The side surface 94A is in contact with, for example, the side surface 82B of the electromagnetic wave absorbing member 80. The thickness dimension along the radial direction of the side surface 94A is formed to be, for example, the same length as the thickness dimension along the radial direction of the side surface 82B. For this reason, the side surface 94A opposes, for example, the total length in the radial direction of the side surface 82B. The side surface 94A is formed, for example, so as to oppose the side surface 93A of the protruding portion 93. For example, the thickness dimension of the side surface 94A is formed larger than the thickness dimension of the side surface 93A.

The outer circumferential surface 94B is a surface that is located on the outer side in the radial direction of the outer surface of the protruding portion 94. The outer circumferential surface 94B is formed, for example, so as to extend in the axial direction and the circumferential direction of the main body portion 90A. The outer circumferential surface 94B has, for example, an inclined surface 94C that is inclined so as to approach the outer circumferential surface of the main body portion 90A from the electromagnetic wave absorbing member 80 side as the distance from the electromagnetic wave absorbing member 80 increases. That is, the protruding portion 94 is formed such that the amount of protruding outward in the radial direction decreases as the distance from the electromagnetic wave absorbing member 80 increases. The inclined surface 94C is provided, for example, on at least a portion of the outer circumferential surface 94B of the protruding portion 94. Here, the portion of the outer circumferential surface 94B closest to the side surface 82B of the electromagnetic wave absorbing member 80 is formed so as to be flush with, for example, the outer circumferential surface 82A of the electromagnetic wave absorbing member 80. That is, the outer circumferential surface 94B of the portion of the protruding portion 94 that comes into contact with the side surface 82B of the electromagnetic wave absorbing member 80 is formed so as to be flush with the outer circumferential surface 82A of the electromagnetic wave absorbing member 80.

The positioning member 90 is attached to the electromagnetic wave absorbing member 80 due to the insertion portion 91 being inserted into the through hole 81 of the electromagnetic wave absorbing member 80 from the side surface 82B side to the side surface 82C side, for example. At this time, the main body portion 90A including the insertion portion 91 is elastically deformed so as to narrow the width of the slit 91X and reduce the diameter. Then, when the protruding portion 93 at the end portion of the main body portion 90A passes through the through hole 81, the main body portion 90A elastically returns so as to return to its original shape, that is, elastically returns so that the width of the slit 91X widens. Then, the side surface 93A of the protruding portion 93 comes into contact with the side surface 82C of the electromagnetic wave absorbing member 80, and the protruding portion 93 is locked to the electromagnetic wave absorbing member 80. Furthermore, at this time, the side surface 94A of the protruding portion 94 comes into contact with the side surface 82B of the electromagnetic wave absorbing member 80, and the protruding portion 94 is locked to the electromagnetic wave absorbing member 80. As a result, a case is suppressed in which the positioning member 90 comes out of the through hole 81, and relative movement of the electromagnetic wave absorbing member 80 with respect to the positioning member 90 is restricted in the length direction of the positioning member 90. In other words, the electromagnetic wave absorbing member 80 is fixed to the positioning member 90 by the protruding portions 93 and 94 provided on both sides of the electromagnetic wave absorbing member 80.

At this time, the fixing portion 92 of the positioning member 90 is provided, for example, between the main body portion 90A and the corrugated tube 50. The fixing portion 92 is formed, for example, so as to extend from the main body portion 90A toward the corrugated tube 50. In other words, the fixing portion 92 is formed so as to extend from the main body portion 90A in a direction away from the pipe 40. As a result, it is possible to suppress interference between the holder 70 attached to the end of the pipe 40 and the fixing portion 92.

Configuration of Fixing Member 100

The fixing member 100 is provided, for example, so as to fix the positioning member 90 to the plurality of wires 20. The fixing member 100 is provided, for example, so as to fix the fixing portion 92 of the positioning member 90 to the plurality of wires 20. The fixing member 100 has, for example, a function of restricting the relative movement of the positioning member 90 with respect to the wires 20 in the length direction of the wires 20.

The fixing member 100 is formed, for example, by winding a tape member 101 around the fixing portion 92 and the wires 20. The tape member 101 has, for example, a pressure-sensitive adhesive layer on one surface. The tape member 101 is wound around the fixing portion 92 and the wires 20, for example, with the pressure-sensitive adhesive layer facing inward in the radial direction. The tape member 101 is wound around, for example, the outer surface of the fixing portion 92 and the outer circumferential surface of the wires 20.

Note that although not shown in the drawings, the tape member 101 has, for example, an overlap winding structure. Here, the overlap winding structure is a structure in which the tape member 101 is spirally wound such that predetermined portions in the width direction of the tape member 91 overlap each other. Note that the width direction of the tape member 101 is a direction extending along the length direction of the wires 20. As the overlap winding structure, for example, a half-wrap winding structure is preferable. Here, the half-wrap winding structure is a structure in which the tape member 101 is spirally wound so that portions that are approximately halfway in the width direction of the tape member 101 overlap each other.

The tape member 101 is formed so as to fasten, for example, the fixing portion 92 and the wires 20 to each other. The tape member 101 covers, for example, the outer surface of the fixing portion 92 and the outer circumferential surface of the plurality of wires 20 so as to fasten them in the direction in which the fixing portion 92 and the plurality of wires 20 approach each other. The tape member 101 is formed, for example, so as to fasten the fixing portion 92 and the wires 20 such that the inner surface of the fixing portion 92 and the outer circumferential surface of the wires 20 come into contact with each other.

The tape member 101 fixes the fixing portion 92 to the outer circumference of the wires 20, for example, such that the wires 20 are arranged offset to a portion in the circumferential direction of the insertion portion 91 inside the insertion portion 91. For example, the tape member 101 is wound around the outer circumferential surface of the fixing portion 92 and the wires 20 such that the wires 20 come into contact with the inner surface of the fixing portion 92 and are offset toward the fixing portion 92 side.

When the positioning member 90 is fixed to the wires 20 by the tape member 101, the electromagnetic wave absorbing member 80 fixed to the positioning member 90 is also fixed to the wires 20. As a result, the relative movement of the electromagnetic wave absorbing member 80 with respect to the wires 20 is restricted in the length direction of the wires 20, and therefore the electromagnetic wave absorbing member 80 can be prevented from being positionally misaligned.

Configuration of Braided Member 110

The braided member 110 has, for example, a tubular shape that collectively surrounds the outer circumference of the plurality of wires 20 overall. The braided member 110 is provided, for example, so as to surround the outer circumference of the wires 20 over substantially the entire length in the length direction of the wires 20. As the braided member 110, a braided member in which a plurality of metal strands are braided or a braided member in which a metal strand and a resin strand are braided in combination with each other can be used. As the material of the metal wire, for example, a metal material such as a copper-based metal material or an aluminum-based metal material can be used. As resin strands, for example, reinforcing fibers having excellent insulating properties and shear resistance such as para-aramid fibers can be used.

The braided member 110 is formed, for example, so as to collectively surround the outer circumference of the plurality of wires 20 in the internal space of the corrugated tube 50. In other words, the corrugated tube 50 is provided so as to surround the outer circumference of the wires 20 and the braided member 110. The braided member 110 is formed, for example, so as to surround the outer circumference of the electromagnetic wave absorbing member 80 and the positioning member 90 between the pipe 40 and the corrugated tube 50. The braided member 110 is formed, for example, such that the outer shape of the portion covering the electromagnetic wave absorbing member 80 and the positioning member 90 is larger than the outer shape of the other portions. The braided member 110 is provided, for example, in the internal space of the protective member 60 so as to surround the outer circumferences of the wires 20, the positioning member 90, the electromagnetic wave absorbing member 80, and the fixing member 100 over the entire circumference in the circumferential direction.

The end portion in the axial direction of the braided member 110 is, for example, electrically connected to the outer circumferential surface of the pipe 40. The end portion in the axial direction of the braided member 110 is connected to the outer circumferential surface of the pipe 40 by a caulking ring 115 provided on the outer circumferential side of the braided member 110 in a state of being in direct contact with the outer circumferential surface of the pipe 40. The caulking ring 115 is fitted to the outside of the pipe 40, for example, in such a manner that the end portion of the braided member 110 is sandwiched between the caulking ring 115 and the outer circumferential surface of the pipe 40. Then, the caulking ring 115 is fastened inward in the radial direction of the pipe 40, whereby the end portion of the braided member 110 is fixed in direct contact with the outer circumferential surface of the pipe 40. As a result, electrical continuity between the braided member 110 and the pipe 40 is stably ensured. The caulking ring 115 is provided, for example, on the outer circumferential surface of the pipe 40 between the end surface 42 of the pipe 40 and the attachment hole 41. The end portions of the braided member 110 are formed, for example, so as to be folded back toward the corrugated tube 50 side and outward in the radial direction. The folded-back braided member 110 is formed, for example, so as to surround the outer circumference of the caulking ring 115. Note that although not shown in the drawing, the end portion on the connector C1 side among the end portions in the axial direction of the braided member 110 is, for example, connected to ground (grounded) at the connector C1 or the like.

As the material of the caulking ring 115, for example, a copper-based, iron-based or aluminum-based metal material can be used. The material of the caulking ring 115 is preferably, for example, a metal material of the same type as the metal material constituting the pipe 40.

Configuration of Restricting Members 120 and 121

The restricting members 120 and 121 are formed so as to fasten the braided member 110, for example, from the outside of the braided member 110 toward the wires 20. The restricting members 120 and 121 are formed so as to fasten the braided member 110 inward in the radial direction, for example. The restricting members 120 and 121 have, for example, a function of restricting the braided member 110 from expanding outward in the radial direction of the wires 20. The restricting members 120 and 121 have, for example, a function of restricting the relative movement of the braided member 110 with respect to the electromagnetic wave absorbing member 80 in the length direction of the wires 20.

The restricting members 120 and 121 are formed, for example, by winding a tape member 122 around the outer circumferential surface of the braided member 110. The tape member 122 has, for example, a pressure-sensitive adhesive layer on one surface. The tape member 122 is wound around the braided member 110, for example, with the pressure-sensitive adhesive layer facing inward in the radial direction. Although not shown in the drawings, the tape member 122 has, for example, an overlap winding structure.

The restricting member 120 is provided, for example, on the outer circumferential surface of the braided member 110 located between the electromagnetic wave absorbing member 80 and the corrugated tube 50. The restricting member 120 is provided so as to overlap with the fixing portion 92, for example, in a direction intersecting the length direction of the wires 20. The restricting member 120 is provided so as to overlap with the fixing member 100, for example, in a direction intersecting the length direction of the wires 20.

The restricting member 121 is provided, for example, on the outer circumferential surface of the braided member 110 located between the electromagnetic wave absorbing member 80 and the pipe 40. The restricting member 121 is provided, for example, on the outer circumferential surface of the braided member 110 located between the positioning member 90 and the holder 70.

The restricting members 120 and 121 do not surround the outer circumference of the electromagnetic wave absorbing member 80, for example. The restricting members 120 and 121 of the present embodiment do not cover the outer circumferential surface of the braided member 110 at the portion covering the outer circumferential surface 82A of the magnetic core 82. That is, the electromagnetic wave absorbing member 80 of the present embodiment is not fixed to the wires 20 by the restricting members 120 and 121. The electromagnetic wave absorbing member 80 of the present embodiment is fastened inward in the radial direction by the braided member 110 fastened inward in the radial direction by the restricting members 120 and 121 provided on both sides of the electromagnetic wave absorbing member 80. As a result, the relative movement of the electromagnetic wave absorbing member 80 with respect to the wires 20 is suppressed. That is, even in a state where the electromagnetic wave absorbing member 80 itself is not fixed to the wires 20, relative movement of the electromagnetic wave absorbing member 80 with respect to the wires 20 can be suppressed.

Configuration of Protective Member 60

The protective member 60 is provided, for example, so as to surround the outer circumference of the electromagnetic wave absorbing member 80. The protective member 60 functions as, for example, a waterproof cover for waterproofing various members arranged inside of the protective member 60.

The protective member 60 includes, for example, a tubular connection tube portion 61 connected to the outer circumference of the pipe 40, a tubular connection tube portion 62 connected to the outer circumference of the corrugated tube 50, and a main body tube portion 63 that is provided between the connection tube portion 61 and the connection tube portion 62. The main body tube portion 63 is formed protruding radially outward from the outer circumference of the other portions, that is, the connection tube portions 61 and 62. The main body tube portion 63 is formed, for example, so as to protrude radially outward from the connection tube portions 61 and 62 over the entire circumference in the circumferential direction of the connection tube portions 61 and 62. The outer circumferential dimension of the main body tube portion 63 is formed to be larger than the outer circumferential dimension of the connection tube portions 61 and 62, for example. The protective member 60 is, for example, a single component formed in one piece by connecting the connection tube portion 61, the main body tube portion 63, and the connection tube portion 62. The connection tube portions 61 and 62 and the main body tube portion 63 of the present embodiment are formed continuously over the entire circumference in the circumferential direction, and are formed in an endless structure in which the start point and the end point coincide with each other. In other words, no slits extending along the length direction of the wires 20 are formed in the connection tube portions 61 and 62 and the main body tube portion 63 of the present embodiment.

In the protective member 60, for example, the connection tube portion 61 is fitted to the outer circumference of the pipe 40, and the connection tube portion 62 is fitted to the outer circumference of the corrugated tube 50.

The connection tube portion 61 is formed in a tubular shape having a size that can be fitted to the outer circumference of the pipe 40, for example. The connection tube portion 61 of the present embodiment is formed in a cylindrical shape. On the inner circumferential surface of the end portion of the connection tube portion 61, for example, one or a plurality (here, three) lips 61A are formed so as to protrude toward the outer circumferential surface of the pipe 40. Each lip 61A is continuously formed, for example, over the entire circumference in the circumferential direction of the inner circumferential surface of the connection tube portion 61, and is formed in an endless structure. Each lip 61A is formed, for example, so as to be in close contact with the outer circumferential surface of the pipe 40 when the connection tube portion 61 is fitted to the outer circumferential surface of the pipe 40.

For example, a coupling member 65 is provided on the outer circumferential surface of the connection tube portion 61. As the coupling member 65, for example, a cable tie made of resin or metal, a caulking ring, a tape member, or the like can be used. The connection tube portion 61 is fastened from the outer circumferential side by the coupling member 65 and fixed to the pipe 40. For example, the connection tube portion 61 is fastened from the outer circumferential side by the coupling member 65 until it is in close contact with the pipe 40 in a liquid-tight manner. As a result, it is possible to suppress a case in which water enters the inside of the protective member 60 from between the connection tube portion 61 and the pipe 40.

The connection tube portion 62 is formed in, for example, a tubular shape having a size that can be fitted to the outer circumference of the corrugated tube 50. The connection tube portion 62 of the present embodiment is formed in a cylindrical shape. On the inner circumferential surface of the end of the connection tube portion 62, for example, one or more (here, three) lips 62A that engage with the corrugated tube 50 are formed. Each lip 62A is formed continuously over the entire circumference in the circumferential direction of the inner circumferential surface of the connection tube portion 62, for example, and is formed in an endless structure. Each lip 62A is formed, for example, so as to enter a ring-shaped recess 52 of the corrugated tube 50 when the connection tube portion 62 is fitted to the outer circumference of the corrugated tube 50.

For example, a coupling member 66 is provided on the outer circumferential surface of the connection tube portion 62. As the coupling member 66, for example, a cable tie made of resin or metal, a caulking ring, a tape member, or the like can be used. The connection tube portion 62 is fastened from the outer circumferential side by the coupling member 66 and is fixed to the corrugated tube 50. For example, the connection tube portion 62 is fastened from the outer circumferential side by the coupling member 66 until it is in close contact with the corrugated tube 50 in a liquid-tight manner. As a result, it is possible to suppress a case in which water enters the inside of the protective member 60 from between the connection tube portion 62 and the corrugated tube 50.

For example, one end portion of the main body tube portion 63 is formed continuously in one piece with the connection tube portion 61, and the other end is formed continuously in one piece with the connection tube portion 62. The main body tube portion 63 is formed in a tubular shape having a size capable of accommodating, for example, the electromagnetic wave absorbing member 80. The main body tube portion 63 of the present embodiment is formed in a cylindrical shape. The main body tube portion 63 is formed so as to surround the electromagnetic wave absorbing member 80 over the entire circumference in the circumferential direction. The main body tube portion 63 is provided, for example, so as to surround the wires 20, the positioning member 90, the electromagnetic wave absorbing member 80, the fixing member 100, the braided member 110, and the restricting members 120 and 121, which are exposed from the pipe 40 and the corrugated tube 50, over the entire circumference in the circumferential direction. The main body tube portion 63 is provided, for example, so as to surround the outer circumference of the caulking ring 115 over the entire circumference in the circumferential direction.

Next, the actions and effects of this embodiment will be described.

(1) The wire harness 10 has the wires 20, the positioning member 90 that is made of a synthetic resin and is provided on the outer circumference of the wires 20, the ring-shaped electromagnetic wave absorbing member 80 that has the through hole 81 through which the wires 20 pass and is fixed to the positioning member 90, and the fixing member 100 for fixing the positioning member 90 to the wires 20. The positioning member 90 has the main body portion 90A including the insertion portion 91 inserted into the through hole 81, and the fixing portion 92 protruding from the main body portion 90A to the outside of the through hole 81. The fixing member 100 is formed so as to fasten the wires 20 and the fixing portion 92 to each other.

According to this configuration, the insertion portion 91 of the positioning member 90 is inserted inside the through hole 81 of the electromagnetic wave absorbing member 80. As a result, the positioning member 90 made of a synthetic resin can be interposed between the inner circumferential surface of the through hole 81 and the wires 20. For this reason, it is possible to suppress direct contact between the inner circumferential surface of the through hole 81 and the outer circumferential surface of the wires 20. As a result, even if the electromagnetic wave absorbing member 80 vibrates due to traveling of the vehicle or the like, it is possible to suppress damage to the wire 20 caused by contact with the edge of the inner circumferential surface of the through hole 81.

(2) Also, the positioning member 90 is fixed to the wires 20 by the fixing member 100, and the electromagnetic wave absorbing member 80 is fixed to the positioning member 90. Therefore, it is possible to suppress positional misalignment of the positioning member 90 with respect to the wires 20, and it is possible to suppress positional misalignment of the electromagnetic wave absorbing member 80 with respect to the wires 20.

(3) The positioning member 90 is provided with the protruding portion 93, which is provided between the insertion portion 91 and the fixing portion 92 and protrudes from the outer circumferential surface of the main body portion 90A in a direction intersecting the length direction of the wires 20. By bringing the side surface 82C of the electromagnetic wave absorbing member 80 into contact with the protruding portion 93, the electromagnetic wave absorbing member 80 can be easily positioned with respect to the positioning member 90. For this reason, the assembly workability of the wire harness 10 can be improved.

(4) Also by bringing the side surface 82C of the electromagnetic wave absorbing member 80 into contact with the protruding portion 93, relative movement of the electromagnetic wave absorbing member 80 with respect to the positioning member 90 in the length direction of the wire 20 can be restricted. As a result, positional misalignment of the electromagnetic wave absorbing member 80 with respect to the positioning member 90 can be suitably suppressed.

(5) The protruding portion 93 is formed such that the amount of protrusion from the outer circumferential surface of the main body portion 90A decreases from the insertion portion 91 side to the fixing portion 92 side. According to this configuration, the outer circumferential surface of the protruding portion 93 is formed on the inclined surface 93C. For this reason, even if the braided member 110 is provided so as to surround the outer circumferential surface of the protruding portion 93, it is possible to suitably suppress damage to the braided member 110 caused by contact with the outer circumferential surface of the protruding portion 93.

(6) The positioning member 90 is provided with a protruding portion 94 protruding from the outer circumferential surface of the end portion on the side opposite to the fixing portion 92 out of the end portions in the axial direction of the main body portion 90A. By bringing the side surface 82B of the electromagnetic wave absorbing member 80 into contact with the protruding portion 94, the electromagnetic wave absorbing member 80 can be easily positioned with respect to the positioning member 90. For this reason, the assembly workability of the wire harness 10 can be improved.

(7) Also, by bringing the side surface 82B of the electromagnetic wave absorbing member 80 into contact with the protruding portion 94, it is possible to restrict relative movement of the electromagnetic wave absorbing member 80 with respect to the positioning member 90 in the length direction of the wires 20. As a result, positional misalignment of the electromagnetic wave absorbing member 80 with respect to the positioning member 90 can be suitably suppressed.

(8) The electromagnetic wave absorbing member 80 is fixed to the positioning member 90 by the protruding portions 93 and 94 of the positioning member 90. According to this configuration, it is not necessary to provide a member for fixing the electromagnetic wave absorbing member 80 to the positioning member 90 separately from the positioning member 90, and therefore the number of components can be reduced.

(9) The protruding portion 94 is formed such that the amount of protrusion from the outer circumferential surface of the main body portion 90A decreases as the distance from the electromagnetic wave absorbing member 80 increases. Also, the outer circumferential surface 94B of the protruding portion 94 at the portion in contact with the side surface 82B of the electromagnetic wave absorbing member 80 is formed so as to be flush with the outer circumferential surface 82A of the electromagnetic wave absorbing member 80. According to this configuration, the outer circumferential surface 94B of the protruding portion 94 is formed flush with the outer circumferential surface 82A of the electromagnetic wave absorbing member 80, and is formed in a tapered shape such that the protruding amount decreases from the portion formed flush with the outer circumferential surface as the distance from the electromagnetic wave absorbing member 80 increases. For example, even if the corner portion of the electromagnetic wave absorbing member 80 is formed at a pin angle, the outer circumferential surface 94B of the protruding portion 94 formed continuously with the outer circumferential surface of the electromagnetic wave absorbing member 80 is formed in a tapered shape, whereby the corner portion of the electromagnetic wave absorbing member 80 can be formed in a pseudo-tapered shape. As a result, even if the braided member 110 is provided so as to surround the outer circumference of the electromagnetic wave absorbing member 80 and the protruding portion 94, it is possible to suitably suppress damage to the braided member 110 caused by contact with the outer circumferential surface 82A of the electromagnetic wave absorbing member 80 and the outer circumferential surface 94B of the protruding portion 94.

(10) The restricting members 120 and 121 were formed such that the braided member 110 was fastened from the outside of the braided member 110 toward the wires 20. For this reason, it is possible to suitably suppress the braided member 110 from expanding outward in the radial direction of the wires 20. As a result, the workability when attaching the protective member 60 so as to cover the outer circumference of the braided member 110 can be improved.

(11) The restricting member 120 is provided so as to surround the outer circumference of the fixing portion 92 of the positioning member 90. For this reason, the braided member 110 is fastened toward the wires 20 and the fixing portion 92 by the restricting member 120. At this time, the thickness of the object to which the braided member 110 is fastened increases by the thickness of the fixing portion 92 compared to the case where the braided member 110 is fastened to only the outer circumferential surface of the wire 20, and therefore the level difference between the outer circumferential surface 82A of the electromagnetic wave absorbing member 80 and the outer circumferential surface of the restricting member 120 can be made smaller. As a result, it is possible to suppress an increase in tension applied to the braided member 110 between the portion surrounding the outer circumferential surface 82A of the electromagnetic wave absorbing member 80 and the portion covered by the restricting member 120, and it is possible to suppress a decrease in the stretchability of the braided member 110 at that portion. As a result, it is possible to suppress wearing of the braided member 110 caused by contact with the outer circumferential surface 82A of the electromagnetic wave absorbing member 80, and it is possible to suppress damage to the braided member 110.

(12) The fixing portion 92 is formed so as to extend from the insertion portion 91 toward the corrugated tube 50. That is, the fixing portion 92 is formed so as to extend from the insertion portion 91 toward the direction away from the metal pipe 40. For this reason, for example, it is possible to suitably suppress interference between the holder 70 attached to the end portion of the pipe 40 and the fixing portion 92.

OTHER EMBODIMENTS

The above-described embodiment can be implemented with the following modifications. The above-described embodiment and the following modified examples can be implemented in combination with each other as long as there is no technical contradiction.

Figure 5:
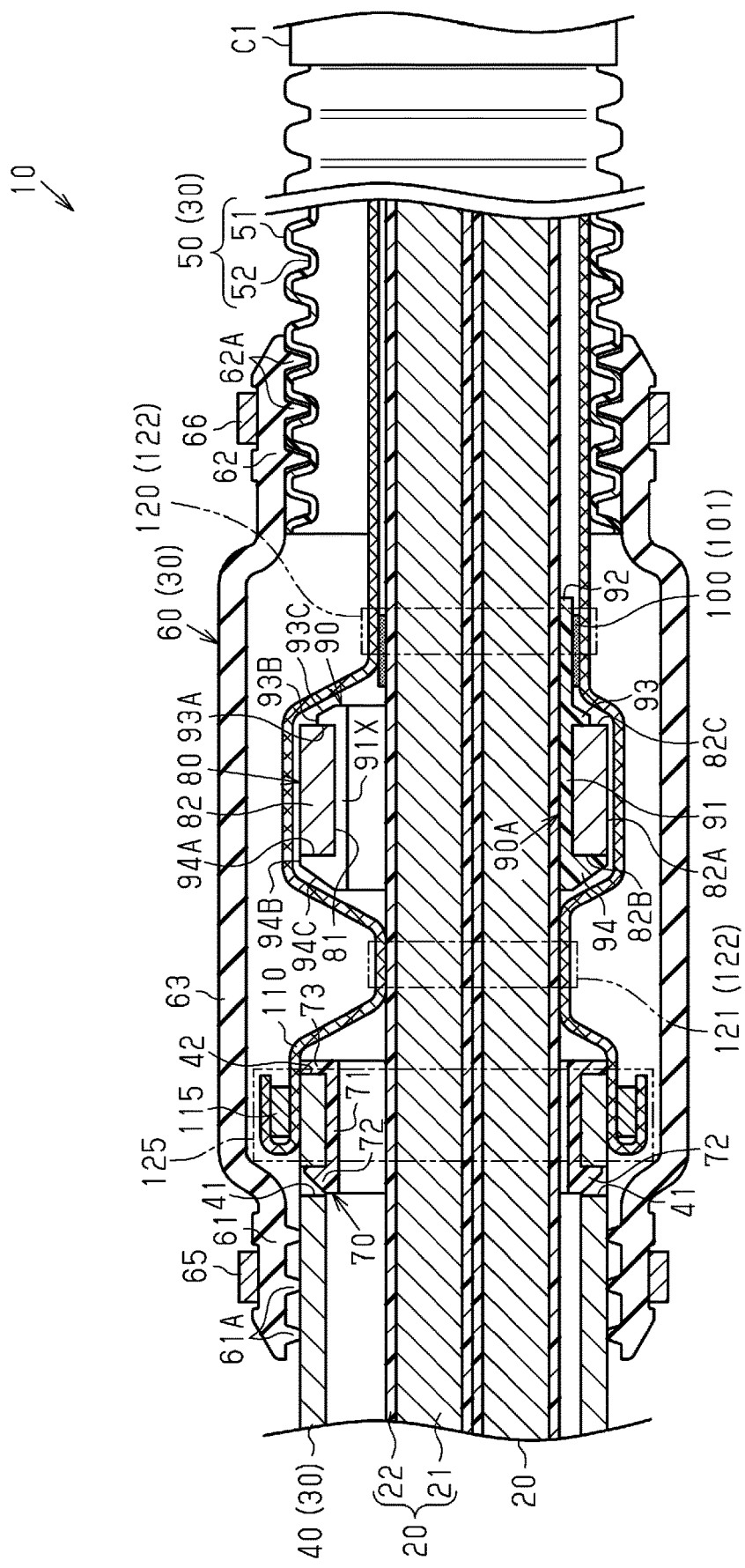
FIG. 5 is a schematic cross-sectional view showing a wire harness according to a modified example.

For example, as shown in FIG. 5, it is also possible to provide a tape member 125 that is wound around the outer circumferential surface of the braided member 110 surrounding the outer circumference of the caulking ring 115.

That is, the tape member 125 may also be wound around the corrugated tube 50 at the end portion of the braided member 110 and the outer circumferential surface of the braided member 110 at the portion folded outward in the radial direction. The tape member 125 is formed, for example, so as to fasten the braided member 110 from the outside of the braided member 110 toward the pipe 40. The tape member 125 is formed, for example, so as to fasten the braided member 110 inward in the radial direction. The tape member 125 is provided so as to overlap with the caulking ring 115, for example, in a direction intersecting the length direction of the wires 20. As a result, the outer circumference of the caulking ring 115 is surrounded by the tape member 125.

The installation positions of the restricting members 120 and 121 of the above-described embodiment are not particularly limited.

Figure 6:
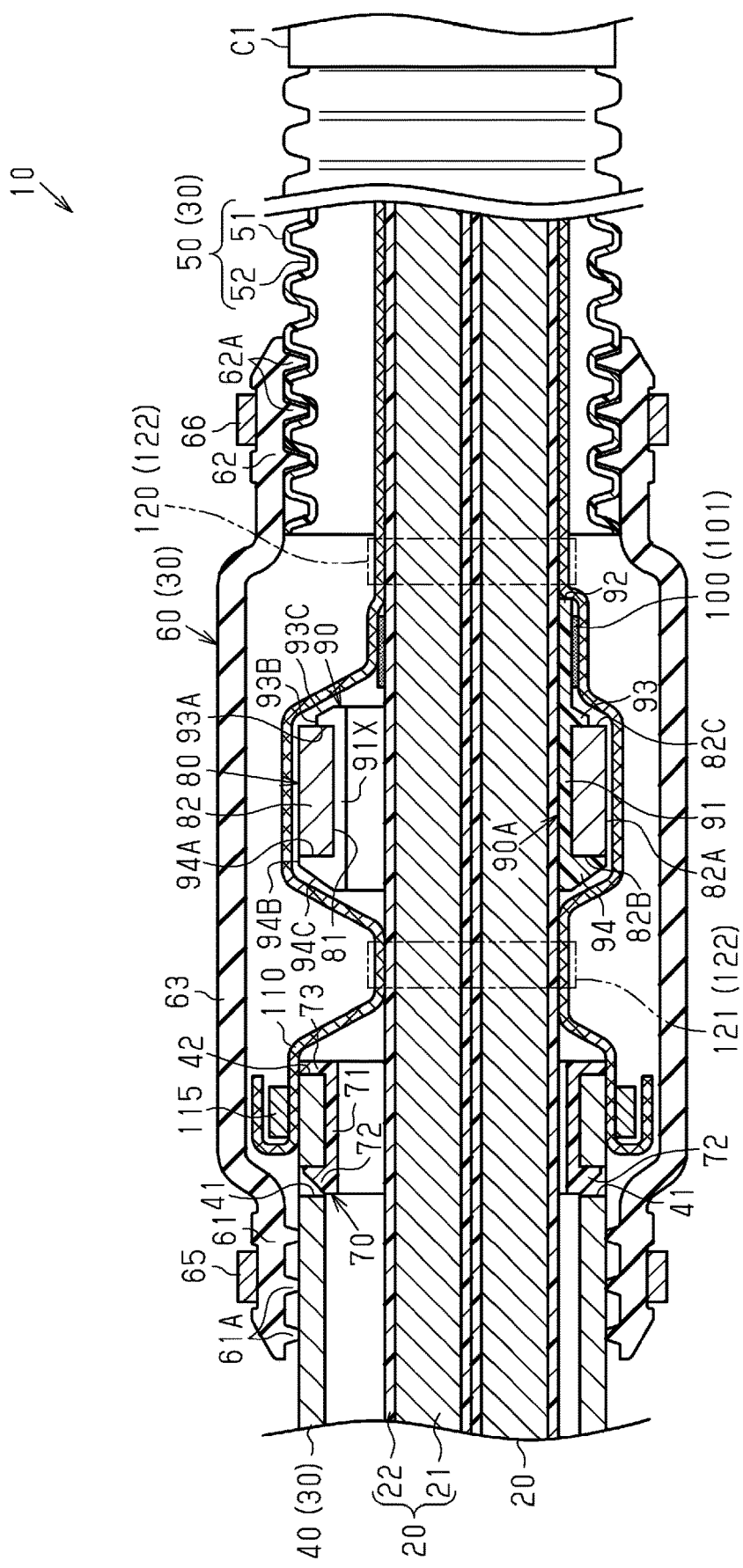
FIG. 6 is a schematic cross-sectional view showing a wire harness according to a modified example.

For example, as shown in FIG. 6, the restricting member 120 may also be provided between the fixing portion 92 and the corrugated tube 50. That is, the restricting member 120 may also be provided at a position that does not overlap with the fixing portion 92 in the direction intersecting the length direction of the wire 20.

In the above-described embodiment, the restricting members 120 and 121 are constituted by the tape member 122, but there is no limitation to this. For example, a metal band or a resin cable tie may be used as the restricting members 120 and 121.

The restricting member 121 of the above-described embodiment may be omitted.

The restricting member 120 of the above-described embodiment may be omitted.

In the above-described embodiment, the fixing member 100 was constituted by the tape member 101, but there is no limitation to this. For example, a metal band or a resin cable tie may be used as the fixing member 100.

In the positioning member 90 of the above-described embodiment, the outer circumferential surface 94B of the portion of the protruding portion 94 that is in contact with the side surface 82B of the electromagnetic wave absorbing member 80 was formed so as to be flush with the outer circumferential surface 82A of the electromagnetic wave absorbing member 80, but there is no limitation to this.

Figure 7:
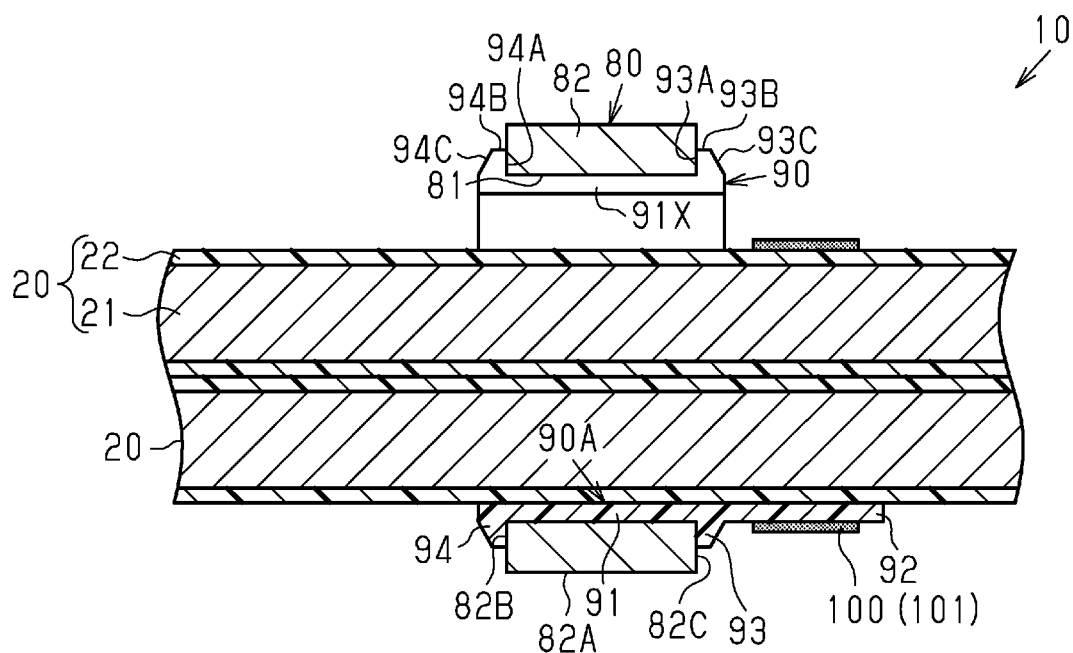
FIG. 7 is a schematic cross-sectional view showing a wire harness according to a modified example.

For example, as shown in FIG. 7, the thickness dimension of the side surface 94A of the protruding portion 94 may be formed smaller than the thickness dimension of the side surface 82B of the electromagnetic wave absorbing member 80. In this case, the side surface 94A opposes only a portion in the radial direction of the side surface 82B.

In the positioning member 90 of the above-described embodiment, the protruding portion 94 was formed such that the protruding amount in the radial direction from the outer circumferential surface of the main body portion 90A decreases as the distance from the electromagnetic wave absorbing member 80 increases. However, the shape of the protruding portion 94 is not limited to this.

Figure 8:
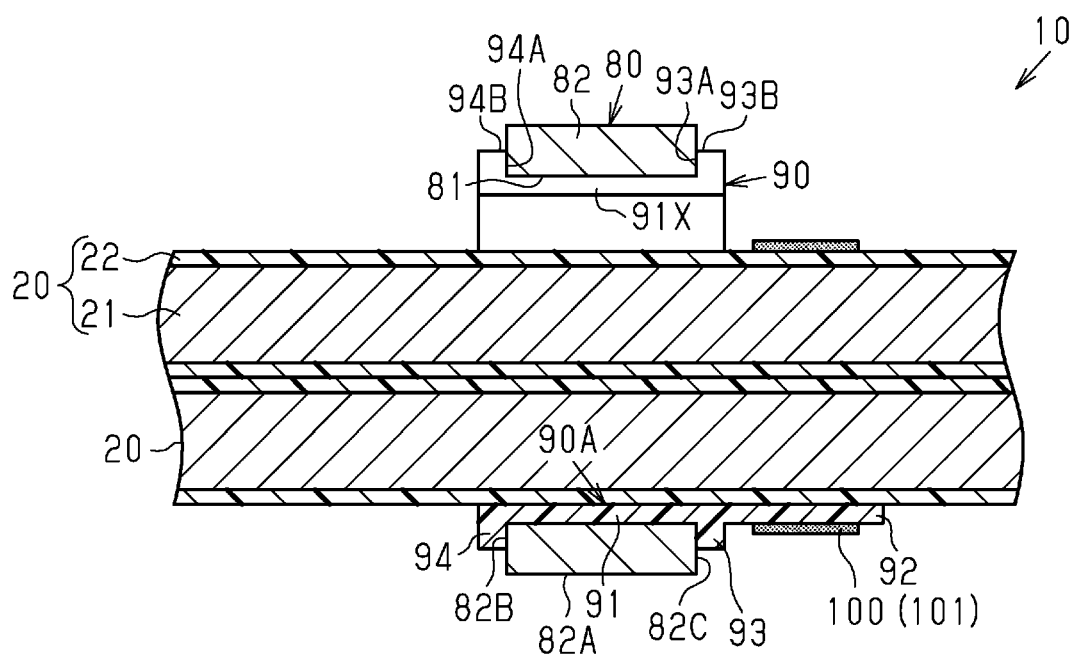
FIG. 8 is a schematic cross-sectional view showing a wire harness according to a modified example.

For example, as shown in FIG. 8, the protruding portion 94 may be formed such that the protrusion amount of the protruding portion 94 is the same over the entire length of the protruding portion 94 in the axial direction of the main body portion 90A. That is, the formation of the inclined surface 94C of the protruding portion 94 may be omitted.

The protruding portion 94 may be omitted from the positioning member 90 of the above-described embodiment.

In the positioning member 90 of the above-described embodiment, the protruding portion 93 was formed such that the protruding amount in the radial direction from the outer circumferential surface of the main body portion 90A decreases from the insertion portion 91 side toward the fixing portion 92. However, the shape of the protruding portion 93 is not limited to this.

For example, as shown in FIG. 8, the protruding portion 93 may be formed such that the protrusion amount of the protruding portion 93 is the same over the entire length of the protruding portion 93 in the axial direction of the main body portion 90A. That is, the formation of the inclined surface 93C of the protruding portion 93 may be omitted.

Figure 9:
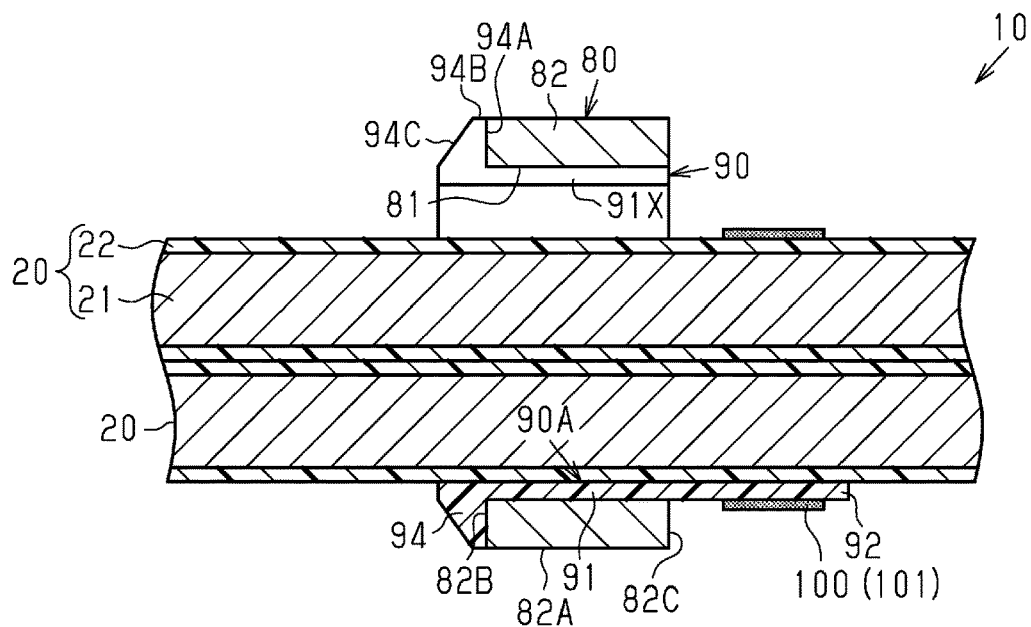
FIG. 9 is a schematic cross-sectional view showing a wire harness according to a modified example.

For example, as shown in FIG. 9, the protruding portion 93 may be omitted from the positioning member 90.

In the positioning member 90 of the above-described embodiment, the main body portion 90A was formed in a tubular shape, but the present disclosure is not limited to this. For example, the transverse cross-sectional shape of the main body portion 90A may be formed in a semicircular shape.

In the above-described embodiment, the fixing portion 92 was arranged between the insertion portion 91 and the corrugated tube 50, but the present disclosure is not limited to this. For example, the fixing portion 92 may be arranged between the insertion portion 91 and the pipe 40.

A plurality of fixing portions 92 may be provided on the positioning member 90 of the above-described embodiment.

In the above-described embodiment, the electromagnetic wave absorbing member 80 was fixed to the positioning member 90 by the protruding portions 93 and 94 of the positioning member 90, but the method of fixing the electromagnetic wave absorbing member 80 to the positioning member 90 is not particularly limited. For example, the electromagnetic wave absorbing member 80 may be fixed to the positioning member 90 by fastening the electromagnetic wave absorbing member 80 toward the positioning member 90 with a tape member or the like.

In the above-described embodiment, the protective member 60 was embodied in an endless structure, but there is no limitation to this. That is, in the above-described embodiment, the protective member 60 was embodied as already being formed as a cylinder in the state before the electromagnetic wave absorbing member 80 is arranged inside, but there is no limitation to this.

Figure 10:
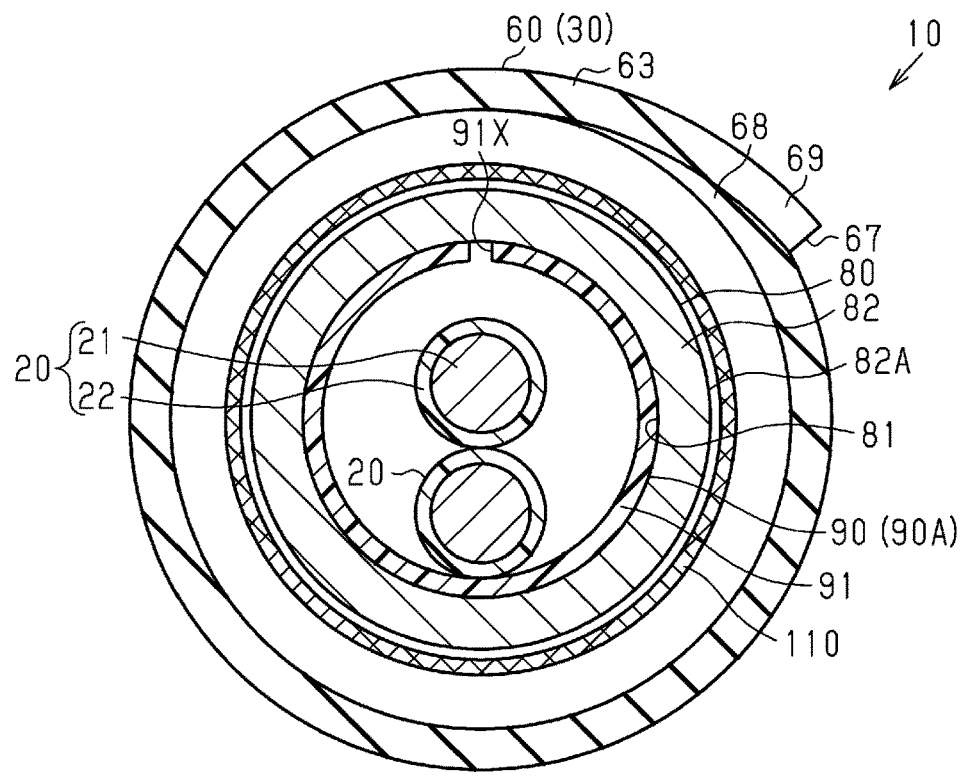
FIG. 10 is a schematic transverse cross-sectional view showing a wire harness according to a modified example.

For example, as shown in FIG. 10, the protective member 60 may also be embodied in a sheet-like structure having a slit 67 extending along the length direction of the wire 20. The protective member 60 of this modified example is formed, for example, so as to have a tubular shape by winding a flexible sheet in the circumferential direction of the wires 20. The protective member 60 has, for example, an end portion 68 in a first direction (in FIG. 10, the circumferential direction of the wires 20) intersecting the length direction of the wires 20, and an end portion 69 on a side opposite to the end portion 68 in the first direction. The protective member 60 is formed so as to have a tubular shape, for example, by overlapping the end portion 68 and the end portion 69 in the radial direction of the electromagnetic wave absorbing member 80. The inner circumferential dimension of the protective member 60 can be adjusted to match the outer circumferential dimension of the electromagnetic wave absorbing member 80 by, for example, adjusting the overlapping width between the end portion 68 and the end portion 69. The protective member 60 has elasticity according to which, for example, it is possible to return from a tubular state capable of surrounding the outer circumference of the electromagnetic wave absorbing member 80 to a sheet state of not surrounding the outer circumference of the electromagnetic wave absorbing member 80.

The protective member 60 is fixed to the outer circumferences of the pipe 40 and the corrugated tube 50 by, for example, the coupling members 65 and 66 shown in FIG. 2, whereby the tubular state is maintained. As the coupling members 65 and 66, for example, a tape member, a cable tie, a caulking ring, or the like can be used.

Figure 11:
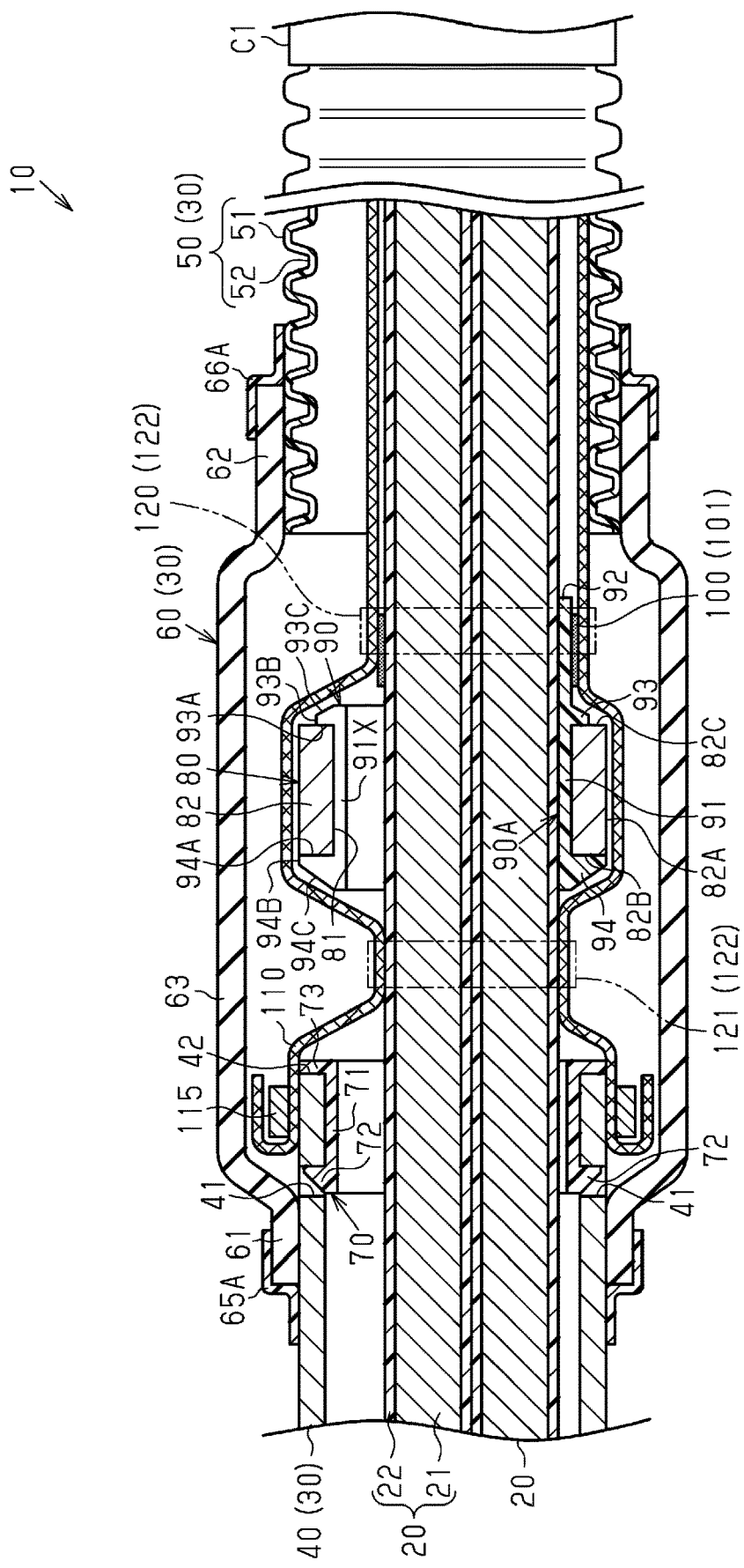
FIG. 11 is a schematic cross-sectional view showing a wire harness according to a modified example.

Next, a configuration used when tape members 65A and 66A are respectively used as the coupling members 65 and 66 will be described with reference to FIG. 11.

The tape member 65A is formed, for example, so as to fix the end portion in the length direction of the protective member 60 to the outer circumferential surface of the pipe 40. The tape member 66A is formed, for example, so as to fix the end portion in the length direction of the protective member 60 to the outer circumferential surface of the corrugated tube 50.

The tape member 65A is wound, for example, over the outer circumferential surface of the end portion in the length direction of the protective member 60 and the outer circumferential surface of the pipe 40 exposed from the protective member 60. The tape member 65A is continuously wound around the range from the outer circumferential surface of the protective member 60 to the outer circumferential surface of the pipe 40, for example. The tape member 65A has, for example, an overlap winding structure. The tape member 65A is wound around the outer circumference of the end portion of the protective member 60 such that, for example, the tubular state of the protective member 60 is maintained.

The tape member 66A is wound, for example, over the outer circumferential surface of the end portion in the length direction of the protective member 60 and the outer circumferential surface of the corrugated tube 50 exposed from the protective member 60. The tape member 66A is continuously wound around the range from the outer circumferential surface of the protective member 60 to the outer circumferential surface of the corrugated tube 50. The tape member 66A has, for example, an overlap winding structure. The tape member 66A is wound around the outer circumference of the end portion of the protective member 60 such that, for example, the tubular state of the protective member 60 is maintained.

An adhesive layer or a pressure-sensitive adhesive layer may be provided on one surface of the protective member 60 shown in FIG. 10. For example, an adhesive layer or a pressure-sensitive adhesive layer may be provided on one surface of the end portion 69 of the protective member 60. According to this configuration, if the end portion 69 is overlaid on the end portion 68 of the protective member 60, the end portion 69 can be adhered to the end portion 68 by an adhesive layer or a pressure-sensitive adhesive layer. As a result, it is possible to suitably suppress a case in which the protective member 60 returns to the sheet state at a stage prior to being fixed by the tape members 65A and 66A (see FIG. 11).

As the material of the protective member 60 of the above-described embodiment, for example, a material having more excellent impact resistance and a more excellent cushioning property than the pipe 40 and the corrugated tube 50 can be used. For example, as the material of the protective member 60, for example, a material having better sound absorption than the pipe 40 and the corrugated tube 50 can be used. As the material of such a protective member 60, for example, a porous material can be used. As the material of the protective member 60, for example, a foamed resin can be used. The bubble structure in the foamed resin may be an open cell structure or a closed cell structure. As the material of the protective member 60, for example, urethane foam, polyethylene foam, ethylene-propylene-diene rubber foam, or the like can be used. By using the material described above as the material of the protective member 60, the protective member 60 can be suitably used as a cushioning member.

According to this configuration, the protective member 60 serving as a cushioning member can be interposed between the electromagnetic wave absorbing member 80 and its peripheral components. As a result, it is possible to suppress the generation of abnormal noise caused by contact between the electromagnetic wave absorbing member 80 and the peripheral components.

In the above-described embodiment, the caulking ring 115 was used as the connecting member for fixing the end portion of the braided member 110 in a state of being electrically connected to the outer circumferential surface of the pipe 40, but there is no limitation to this. For example, instead of the caulking ring 115, a metal band, a resin cable tie, a tape member, or the like may be used as the connecting member.

In the above-described embodiment, the first outer cover member was embodied in the metal pipe 40, and the second outer cover member was embodied in the corrugated tube 50, but the present disclosure is not limited thereto. As the first outer cover member, for example, a hard resin pipe, a corrugated tube, or a rubber waterproof cover can be used. Also, as the second outer cover member, for example, a hard resin pipe, a metal pipe, or a rubber waterproof cover can be used. For example, the first outer cover member and the second outer cover member may be embodied in outer cover members of the same type.

Figure 12:
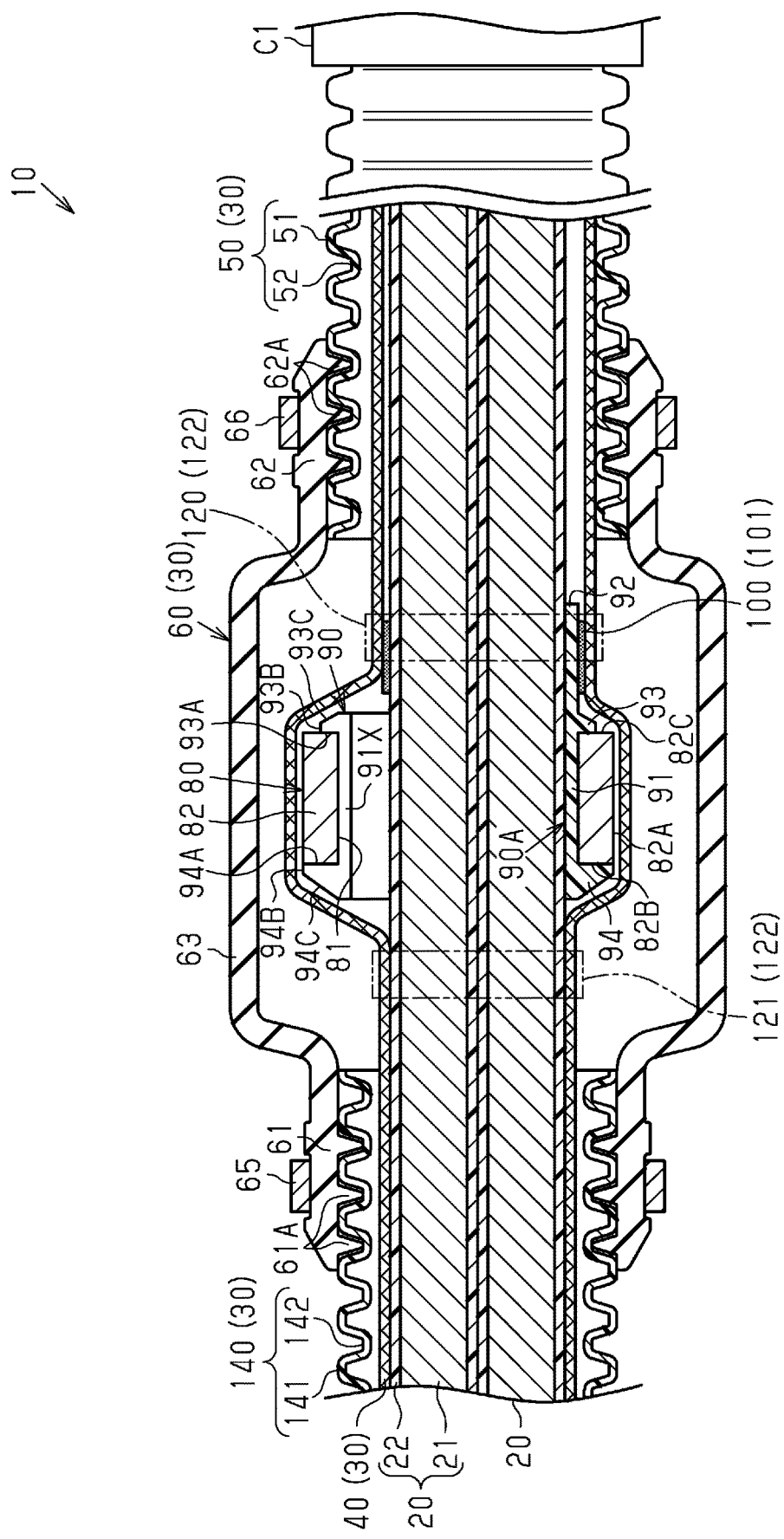
FIG. 12 is a schematic cross-sectional view showing a wire harness according to a modified example.

For example, as shown in FIG. 12, the first outer cover member (first outer cover) may be embodied in the corrugated tube 140, and the second outer cover member (second outer cover) may be embodied in the corrugated tube 50. The corrugated tube 140 is provided spaced apart from the corrugated tube 50, for example, in the length direction of the wires 20. The corrugated tube 140 is provided, for example, so as to surround the outer circumference of the plurality of wires 20 over the entire circumference in the circumferential direction. The corrugated tube 140 is provided, for example, so as to surround a portion in the length direction of the wires 20. The corrugated tube 140 has an accordion structure in which ring-shaped protrusions 141 and ring-shaped recesses 142 are arranged alternatingly along the length direction of the corrugated tube 140. The braided member 110 of the present modified example is formed, for example, so as to collectively surround the outer circumference of the plurality of wires 20 in the internal space of the corrugated tube 140. In other words, the corrugated tube 140 is provided so as to surround the outer circumference of the wires 20 and the braided member 110. The protective member 60 of this modified example is provided so as to bridge between the outer circumference of the corrugated tube 140 and the outer circumference of the corrugated tube 50, for example. For example, in the protective member 60, the connection tube portion 61 is fitted to the outer circumference of the corrugated tube 140, and the connection tube portion 62 is fitted to the outer circumference of the corrugated tube 50.

In the above-described embodiment, the braided member 110 was provided so as to cover the outer circumference of the electromagnetic wave absorbing member 80, but there is no limitation to this. For example, the braided member 110 may be passed through the through hole 81 of the electromagnetic wave absorbing member 80. In this case, the braided member 110 is passed through the through hole 81 while surrounding the outer circumference of the plurality of wires 20, for example.

Instead of the braided member 110 of the above-described embodiment, another electromagnetic shielding member (electromagnetic shield) such as metal foil may be used.

The braided member 110 in the above-described embodiment may also be omitted.

The wires 20 of the above-described embodiment may also be changed to shielded wires.

In the above-described embodiment, the electromagnetic wave absorbing member 80 was constituted by only the magnetic core 82, but there is no limitation to this. For example, the electromagnetic wave absorbing member 80 may also be configured to include a magnetic core 82 and a case for accommodating the magnetic core 82.

There is no particular limitation to the number and installation position of the electromagnetic wave absorbing member 80 in the above-described embodiment. For example, two or more electromagnetic wave absorbing members 80 may be provided for the wire harness 10.

In the above-described embodiment, there were two wires 20 accommodated inside of the outer cover member 30, but the number of wires 20 is not particularly limited, and the number of wires 20 can be changed according to the specification of the vehicle V. For example, the number of wires 20 accommodated inside the outer cover member 30 may be one or three or more. For example, it is possible to use a configuration in which a low-voltage wire connecting a low-voltage battery and various low-voltage devices (e.g., a lamp, car audio, etc.) is added as a wire accommodated in the outer cover member 30.

The arrangement relationship between the inverter 11 and the high-voltage battery 12 in the vehicle V is not limited to the above-described embodiment, and may be appropriately changed according to the vehicle configuration.

Figure 13:
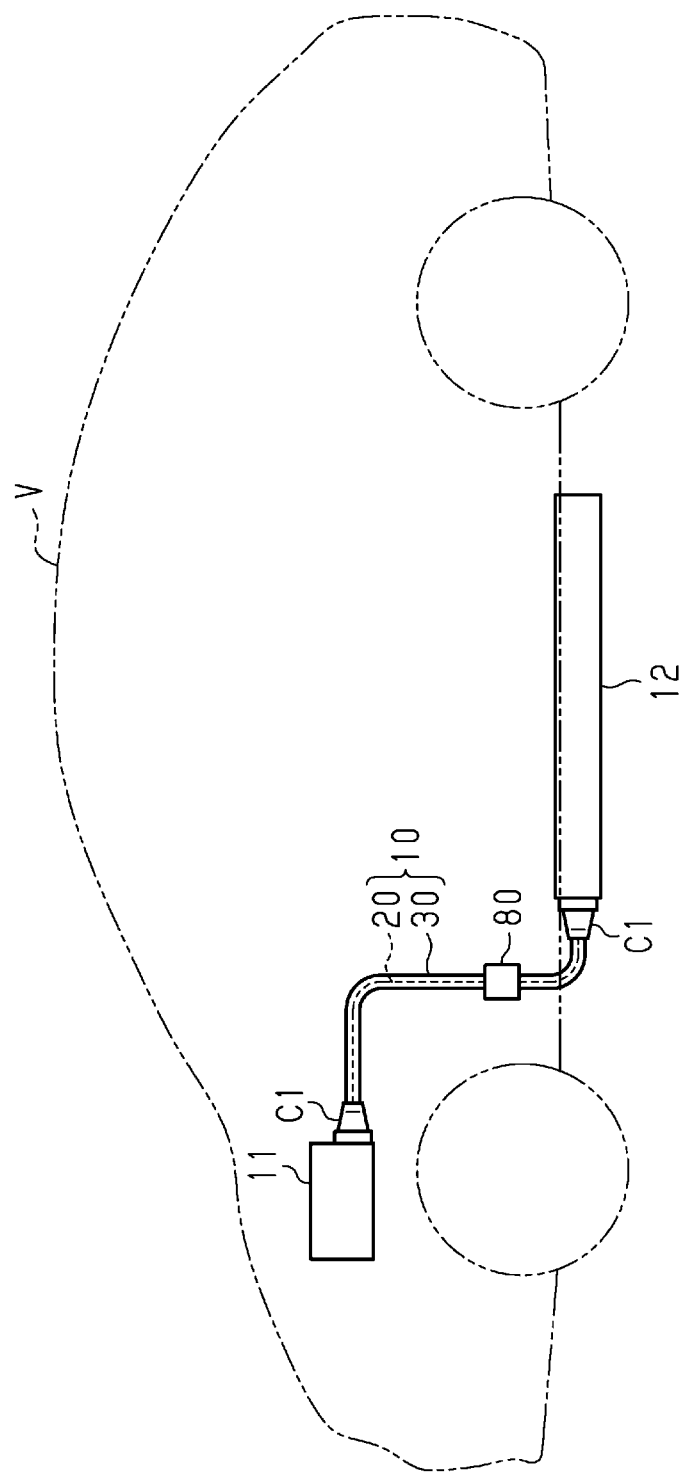
FIG. 13 is a schematic configuration diagram showing a wire harness according to a modified example.

For example, as shown in FIG. 13, the high-voltage battery 12 may be arranged on approximately the entirety of the floor of the vehicle V and may be embodied in a wire harness 10 that electrically connects the high-voltage battery 12 and the inverter 11.

In the above-described embodiment, the inverter 11 and the high-voltage battery 12 were adopted as the electric devices connected by the wire harness 10, but there is no limitation to this. For example, the present disclosure may be adopted in a wire connecting the inverter 11 and the motor for driving the wheels. That is, the present disclosure is applicable as long as it electrically connects electric devices mounted in the vehicle V.

As in the embodiment shown in the drawings, the opening terminal end portion of the first outer cover member 40 may be separated with a space from the opening terminal end portion of the second outer cover member 50. The predetermined position in the axial direction of the wires 20 may be positioned in the axial direction gap formed between the opening terminal end portion of the first outer cover member 40 and the opening terminal end portion of the second outer cover member 50. The opening terminal end portion of the first outer cover member 40 may face the side surface 82B of the electromagnetic wave absorbing member 80, and the opening terminal end portion of the second outer cover member 50 may face the side surface 82C of the electromagnetic wave absorbing member 80.

The protective member 60 of the embodiment shown in the drawings may be configured as a continuous tubular body that couples the opening terminal end portion of the first outer cover member 40 and the opening terminal end portion of the second outer cover member 50 such that the opening terminal end portion of the first outer cover member 40 and the opening terminal end portion of the second outer cover member 50 are spaced apart from each other by a gap in the axial direction. The protective member 60 of the illustrated embodiment may have a first tubular end portion configured to be attached to the outer surface in the radial direction of the opening terminal end portion of the first outer cover member 40, a second tubular end portion configured to be attached to the outer surface in the radial direction of the opening terminal end portion of the second outer cover member 50, and a tubular intermediate portion that extends between the first tubular end portion and the second tubular end portion. In one example, the tubular intermediate portion may be configured such that the gap in the axial direction formed between the opening terminal end portion of the first outer cover member 40 and the opening terminal end portion of the second outer cover member 50 is not exposed to the outside of the wire harness 10. In the embodiment shown in the drawings, the tubular intermediate portion of the protective member 60 may be configured to cover the entirety of the electromagnetic wave absorbing member 80 sandwiched between the opening terminal end portion of the first outer cover member 40 and the opening terminal end portion of the second outer cover member 50, and the exposed portion of the braided member 110 that is not covered by the first outer cover member 40 and the second outer cover member 50.

The insertion portion 91 of the positioning member 90 of the embodiment may have a first curvature radius when the insertion portion 91 of the positioning member 90 is in a first state in which it is not inserted between the electromagnetic wave absorbing member 80 and the wires 20, and may have a second curvature radius different from the first curvature radius when the insertion portion 91 of the positioning member 90 is in a second state of being inserted between the electromagnetic wave absorbing member 80 and the wires 20. The insertion portion 91 may be configured to elastically deform, for example, reversibly between the first curvature radius and the second curvature radius.

When the insertion portion 91 is in the second state, the inward-facing surface in the radial direction of the insertion portion 91 may press the outward-facing surface in the radial direction of the wire 20 and may come into frictional contact with the outward-facing surface in the radial direction of the wire 20.

The fixing portion 92 of the positioning member 90 of the embodiment may have a third curvature radius when the insertion portion 91 of the positioning member 90 is in the first state where it is not inserted between the electromagnetic wave absorbing member 80 and the wires 20, and may have a fourth curvature radius that is the same as or different from the third curvature radius when the insertion portion 91 of the positioning member 90 is in the second state of being inserted between the electromagnetic wave absorbing member 80 and the wires 20. The third curvature radius of the fixing portion 92 may be the same as the first curvature radius of the insertion portion 91. The fourth curvature radius of the fixing portion 92 may be the same as or different from the second curvature radius of the insertion portion 91. When the fixing member 100 is wound around the outer surface of the fixing portion 92 covering the first portion of the outer surface of the wires 20 and a second portion that is not covered by the fixing portion 92 and is different from the first portion of the outer surface of the wires 20, the inward-facing surface in the radial direction of the fixing portion 92 may press the outward-facing surface in the radial direction of the wires 20. When the fixing member 100 is not wound around the outer surface of the fixing portion 92, the inward-facing surface in the radial direction of the fixing portion 92 comes into frictional contact with the outward-facing surface in the radial direction of the wires 20 in one example, but need not press the outward-facing surface in the radial direction of the wires 20.

The electromagnetic wave absorbing member 80 of the embodiment is referred to as an electromagnetic noise filter in some cases. The positioning member 90 and the fixing member 100 of the embodiment may function as an electromagnetic noise filter anchor element configured to attach the electromagnetic wave absorbing member 80 at a predetermined position in the axial direction of the wire 20, for example, coaxially with the wires 20.

The embodiments disclosed herein are to be considered exemplary in all respects and not restrictive. The scope of the present disclosure is indicated by the scope of claims, not the above-mentioned meaning, and is intended to encompass all modifications within the meaning and scope equivalent to the scope of claims.

The invention claimed is:

1. A wire harness comprising:
   a wire;
   a positioning member that is made of a synthetic resin and is provided on an outer circumference of the wire;

a ring-shaped electromagnetic wave absorber that has a through hole through which the wire passes and is fixed to the positioning member; and a fixing member for fixing the positioning member to the wire, wherein:

the positioning member includes:
- a main body including an insertion portion inserted in the through hole,
- a fixing portion protruding from the main body to an outside of the through hole, and
- a first protrusion that protrudes from an outer surface of the insertion portion in a radially outward direction, such that, when the insertion portion is inserted in the through hole of the electromagnetic wave absorber, the electromagnetic wave absorber extends further radially outward than the first protrusion, the fixing member is formed so as to fasten the wire and the fixing portion to each other, the main body has a tubular shape through which the wire passes, the main body has a slit that extends in an axial direction of the main body, the positioning member has a second protrusion that protrudes in a direction intersecting the axial direction from the outer circumferential surface at an end on a side opposite to the fixing portion out of the ends in the axial direction of the main body, the second protrusion opposes a second side surface of the electromagnetic wave absorber, the second protrusion is formed such that an amount of protrusion from the outer circumferential surface of the main body decreases as a distance from the electromagnetic wave absorber increases, the second protrusion is in contact with the second side surface of the electromagnetic wave absorber, and the outer circumferential surface of the second protrusion at the portion in contact with the second side surface is formed so as to be flush with the outer circumferential surface of the electromagnetic wave absorber.

2. The wire harness according to claim 1, wherein:
the first protrusion is provided between the insertion portion and the fixing portion and protrudes in a direction intersecting a length direction of the wire from an outer circumferential surface of the main body, and the first protrusion opposes a first side surface of the electromagnetic wave absorber.

3. The wire harness according to claim 2, wherein the first protrusion is formed such that an amount of protrusion from the outer circumferential surface of the main body decreases from an insertion portion side to a fixing portion side.

4. The wire harness according to claim 1, further comprising:
- an electromagnetic shield that surrounds an outer circumference of the wire, the positioning member, and the electromagnetic wave absorber; and
- a restricting member that covers an outer circumferential surface of the electromagnetic shield, wherein the restricting member is formed such that the electromagnetic shield is fastened from an outside of the electromagnetic shield toward the wire.

5. The wire harness according to claim 4, wherein the restricting member is provided so as to overlap with the fixing portion in a direction intersecting a length direction of the wire.

6. The wire harness according to claim 1, further comprising:
- a first outer cover accommodating the wire;
- a second outer cover that accommodates the wire and is provided spaced apart from the first outer cover in a length direction of the wire; and
- a protective member that covers an outer circumference of the electromagnetic wave absorber and the positioning member and is fixed so as to bridge between an outer circumference of the first outer cover and an outer circumference of the second outer cover, wherein the electromagnetic wave absorber is provided between the first outer cover and the second outer cover in the length direction of the wire.

7. The wire harness according to claim 6, wherein:
the first outer cover is a metal pipe,
the second outer cover is an outer cover made of a synthetic resin, and
the fixing portion is provided between the insertion portion and the second outer cover.

8. The wire harness according to claim 6, wherein:
the protective member is a waterproof member for waterproofing a member accommodated in the protective member, and
the fixing member is a tape wound around the fixing portion and the wire.

* * * * *